(12) United States Patent
Savant et al.

(10) Patent No.: US 12,142,682 B2
(45) Date of Patent: Nov. 12, 2024

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Chandrashekhar Prakash Savant, Hsinchu (TW); Kin Shun Chong, Hsinchu (TW); Tien-Wei Yu, Kaohsiung (TW); Chia-Ming Tsai, Zhubei (TW); Ming-Te Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 521 days.

(21) Appl. No.: 17/390,817

(22) Filed: Jul. 30, 2021

(65) Prior Publication Data

US 2022/0059684 A1    Feb. 24, 2022

Related U.S. Application Data

(62) Division of application No. 16/532,274, filed on Aug. 5, 2019, now Pat. No. 11,081,584.

(Continued)

(51) Int. Cl.
*H01L 21/02* (2006.01)
*H01L 29/66* (2006.01)
*H01L 29/78* (2006.01)

(52) U.S. Cl.
CPC ...... *H01L 29/785* (2013.01); *H01L 21/02153* (2013.01); *H01L 21/02186* (2013.01);
(Continued)

(58) Field of Classification Search
CPC ............ H01L 29/785; H01L 29/66545; H01L 29/66795; H01L 29/0924; H01L 29/4966;
(Continued)

(56) References Cited

U.S. PATENT DOCUMENTS 9,356,125 B1    5/2016    Hsiao et al.
9,418,853 B1    8/2016    Wang et al.
(Continued)

FOREIGN PATENT DOCUMENTS

CN    102103994 A    6/2011
CN    105990143 A    10/2016
(Continued)

OTHER PUBLICATIONS

Non-Final Office Action issued in U.S. Appl. No. 16/532,274, dated Oct. 22, 2020.
(Continued)

*Primary Examiner* — Farun Lu
*Assistant Examiner* — Sandra Milena Rodriguez Villan
(74) *Attorney, Agent, or Firm* — STUDEBAKER & BRACKETT PC

(57) ABSTRACT

In a method of manufacturing a semiconductor device, a gate dielectric layer is formed over a channel region, a first conductive layer is formed over the gate dielectric layer, a shield layer is formed over the first conductive layer forming a bilayer structure, a capping layer is formed over the shield layer, a first annealing operation is performed after the capping layer is formed, the capping layer is removed after the first annealing operation, and a gate electrode layer is formed after the capping layer is removed.

20 Claims, 17 Drawing Sheets

Related U.S. Application Data

(60) Provisional application No. 62/753,033, filed on Oct. 30, 2018.

(52) U.S. Cl.
CPC .... *H01L 21/0228* (2013.01); *H01L 21/02362* (2013.01); *H01L 29/66545* (2013.01); *H01L 29/66795* (2013.01)

(58) Field of Classification Search
CPC ......... H01L 21/02153; H01L 21/02186; H01L 21/0228; H01L 21/02362; H01L 21/02321; H01L 21/02332; H01L 21/02337; H01L 21/321; H01L 21/823821; H01L 21/823828; H01L 21/0217; H01L 21/02592; H01L 21/02595; H01L 21/02598; H01L 21/28088; H01L 21/324; H01L 21/28185
See application file for complete search history.

(56) References Cited

U.S. PATENT DOCUMENTS

| | | | |
|---|---|---|---|
| 9,634,118 B2 | 4/2017 | Kim | |
| 9,722,030 B1 | 8/2017 | Hsieh et al. | |
| 10,157,998 B2 | 12/2018 | Wang et al. | |
| 10,276,399 B2 | 4/2019 | Hou et al. | |
| 2003/0077897 A1* | 4/2003 | Tsai | H01L 21/76807 |
| | | | 438/634 |
| 2011/0143529 A1 | 6/2011 | Lee et al. | |
| 2014/0070377 A1 | 3/2014 | Yu et al. | |
| 2017/0053996 A1* | 2/2017 | Kim | H01L 21/823842 |
| 2017/0170027 A1* | 6/2017 | Hou | H01L 29/0657 |
| 2017/0256455 A1 | 9/2017 | Kim et al. | |
| 2018/0247829 A1 | 8/2018 | Hou et al. | |
| 2018/0261460 A1 | 9/2018 | Hwang et al. | |

FOREIGN PATENT DOCUMENTS

| | | |
|---|---|---|
| CN | 106972049 A | 7/2017 |
| CN | 107887428 A | 4/2018 |
| KR | 10-2018-0104476 A | 9/2018 |
| TW | 2017-32904 A | 9/2017 |

OTHER PUBLICATIONS

2 Notice of Allowance issued in U.S. Appl. No. 16/532,274, dated Mar. 31, 2021.

* cited by examiner

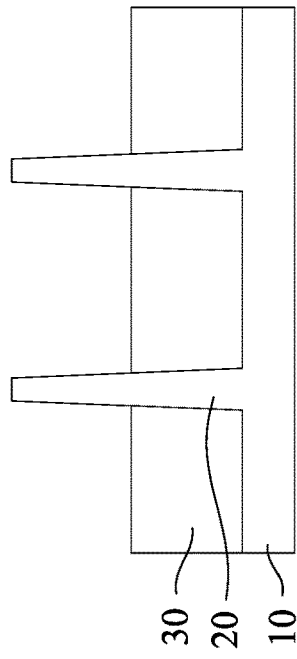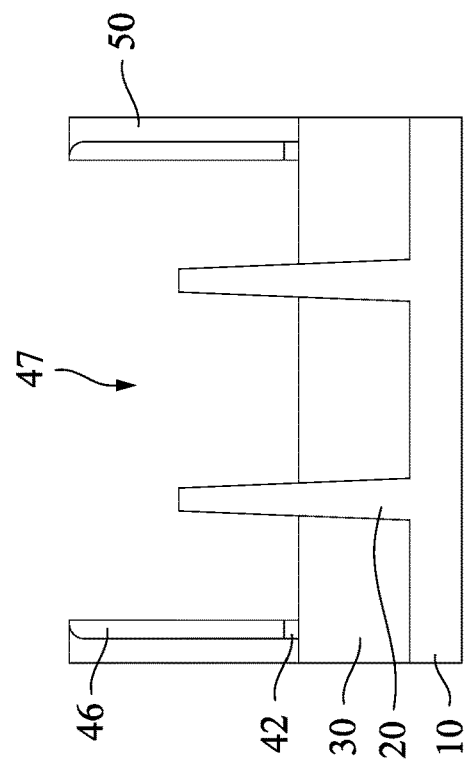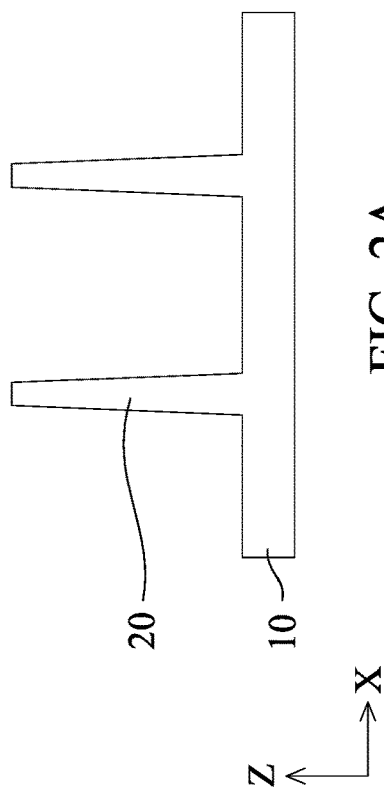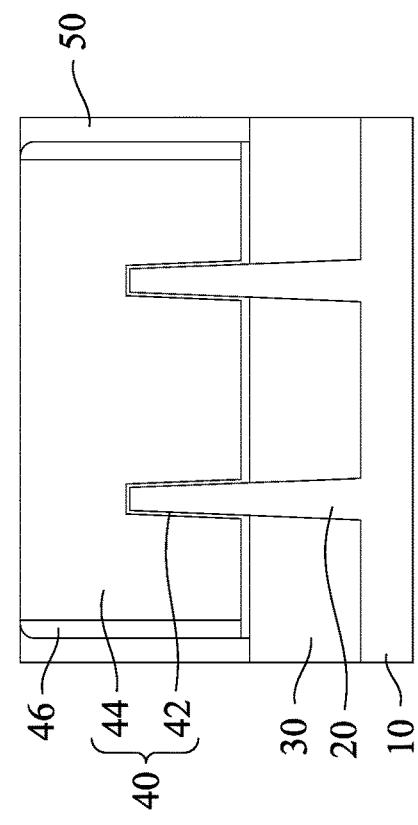
FIG. 2A
FIG. 2B
FIG. 2C
FIG. 2D

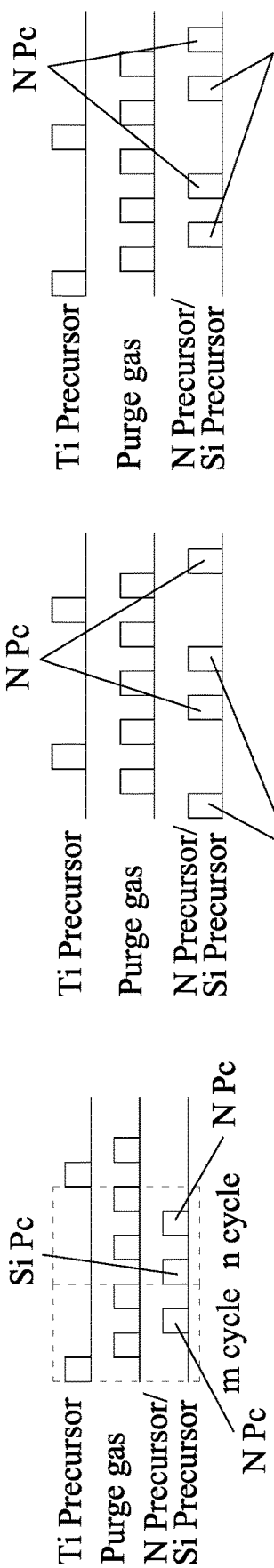
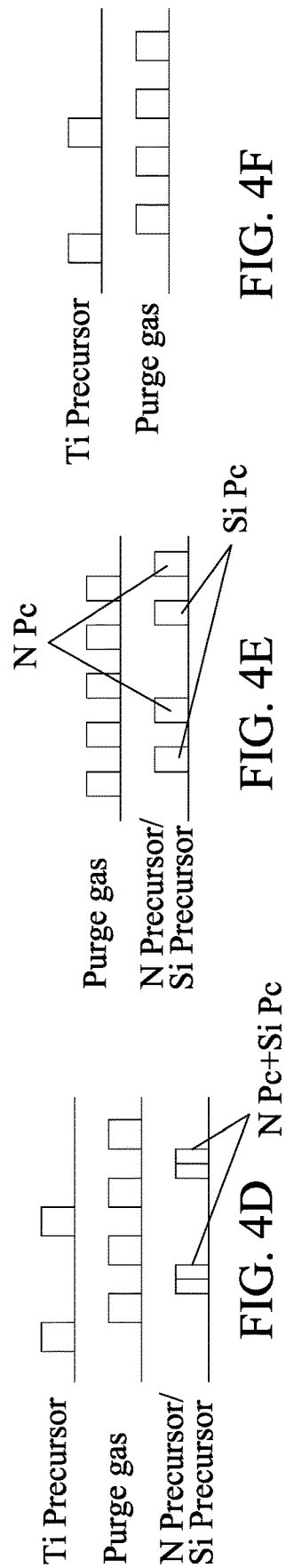
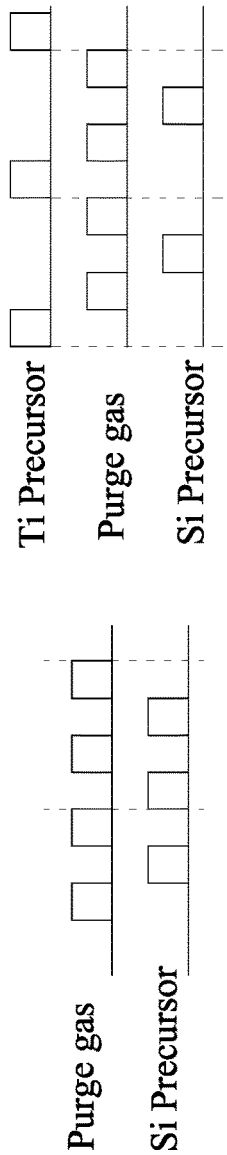
FIG. 4A  FIG. 4B  FIG. 4C
FIG. 4D  FIG. 4E  FIG. 4F
FIG. 4G  FIG. 4H

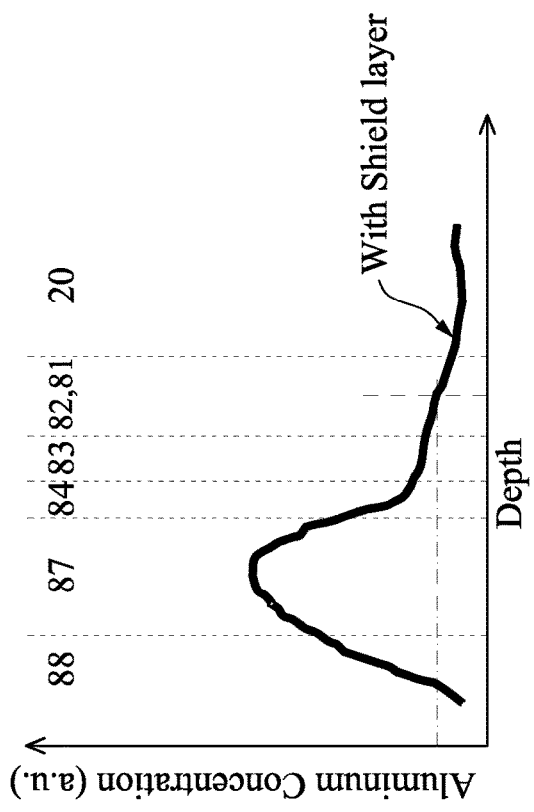
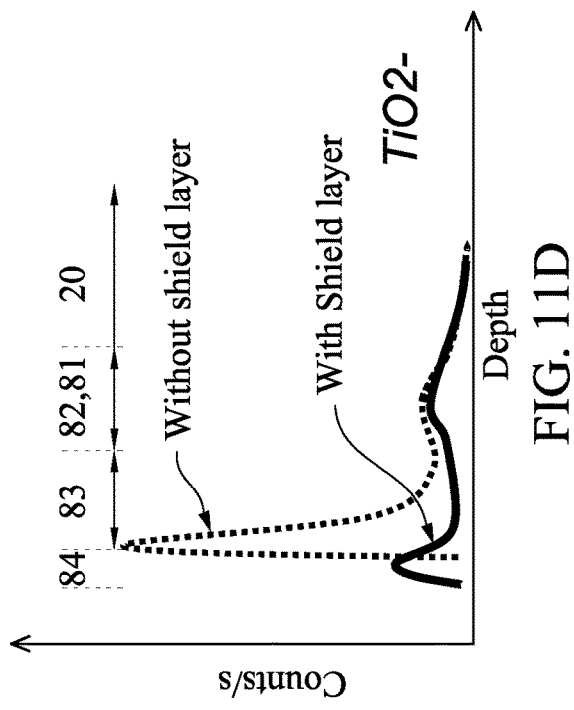
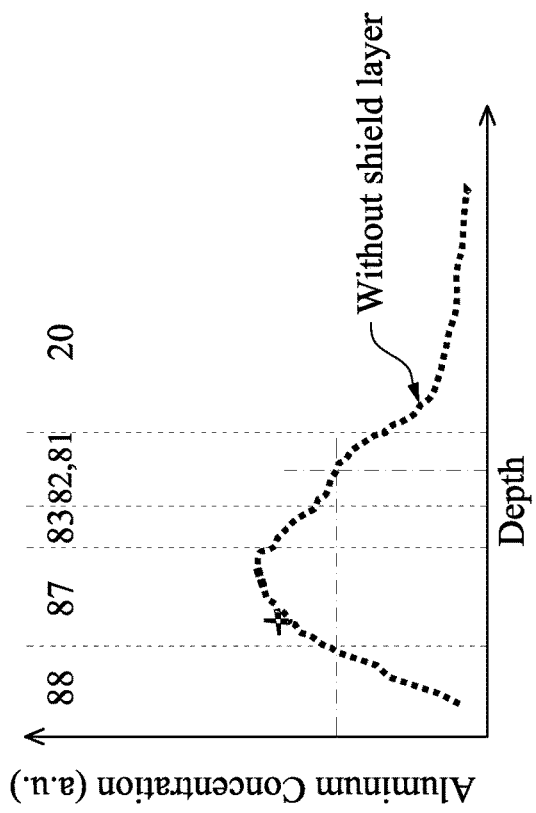
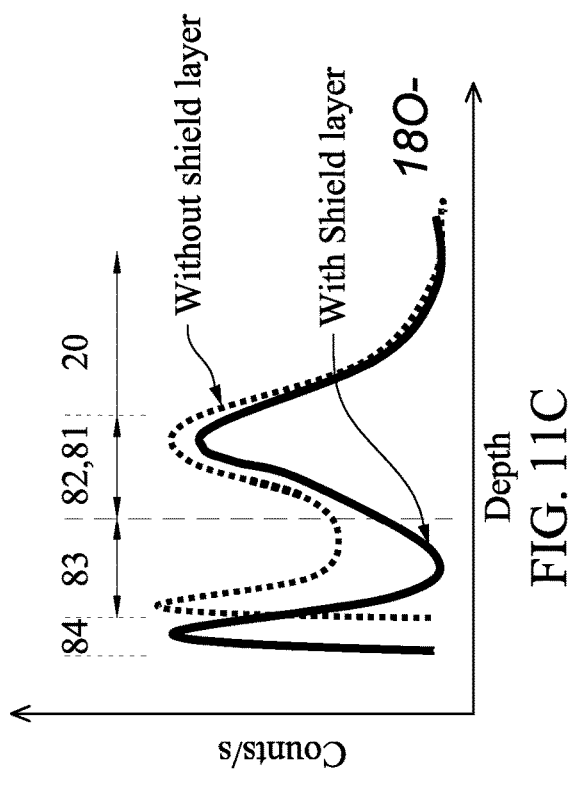
FIG. 11A
FIG. 11B
FIG. 11C
FIG. 11D

METHOD OF MANUFACTURING SEMICONDUCTOR DEVICES AND SEMICONDUCTOR DEVICES

RELATED APPLICATIONS

This application is a divisional of U.S. patent application Ser. No. 16/532,274 filed Aug. 5, 2019, now U.S. Pat. No. 11,081,584, which claims the benefit of priority of U.S. Provisional Patent Application No. 62/753,033 filed Oct. 30, 2018, the entire disclosure of each of which is incorporated herein by reference.

BACKGROUND

With increasing down-scaling of integrated circuits and increasingly demanding requirements of speed of integrated circuits, transistors need to have higher drive currents with increasingly smaller dimensions. Fin Field-Effect Transistors (FinFET) were thus developed. FinFETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins. Since FinFETs have a three-dimensional channel structure, ion implantation processes to the channel require extra care to reduce any geometrical effects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C and 2D show cross sectional views of various stages of a sequential manufacturing process of a semiconductor device according to an embodiment of the present disclosure.

FIGS. 4A, 4B, 4C, 4D, 4E, 4F, 4G and 4H show various gas supplying timings for ALD operations.

FIGS. 11A, 11B, 11C and 11D show element analysis results along a depth direction of gate structures.

DETAILED DESCRIPTION

Figure 1A:
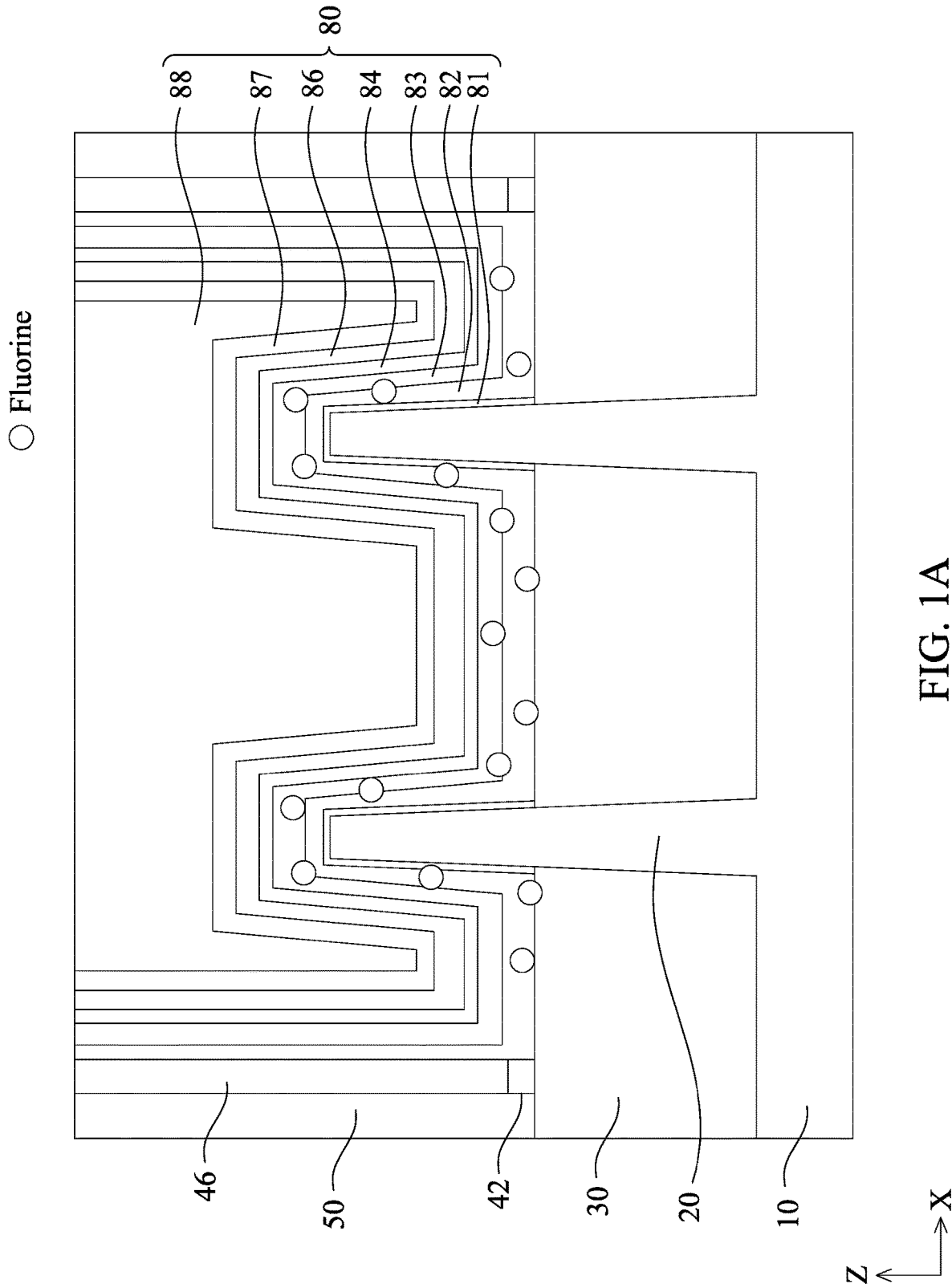
FIG. 1A shows a cross section view of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain.

Disclosed embodiments relate to a semiconductor device, in particular, a fin field effect transistor (Fin FET) and its manufacturing method. The embodiments such as those disclosed herein are generally applicable not only to Fin FETs but also to double-gate, surround-gate, omega-gate or gate-all-around (GAA) transistors, and/or nanowire transistors, or any suitable device having a three-dimensional channel structure.

In FinFET structures, building multiple Vt devices with low Vt is very crucial for low power consumption and boosting device performance. Composition and thickness of metal gate films play crucial role in defining the device work function, Vt. Fluorine (F) incorporation within a silicon cap (a fluorinated silicon cap (FSI)) helps PMOS boost and device reliability gain. However, the formation of a FSI is not compatible with a TiN film due to etching and TiN loss by fluorine. A semiconductor device includes source and drain and a gate stack there between. The gate stack includes a gate dielectric layer over a substrate, a dielectric capping layer (e.g., a titanium nitride (TiN)) above the gate dielectric layer, a barrier layer (e.g., TaN or similar metal nitride) above the dielectric capping layer, and a gate electrode layer above the barrier layer. The gate dielectric includes an interfacial layer (IL) and a high-k dielectric layer (HK). The gate electrode includes a metal gate work function layer and a body metal layer.

During the manufacture of the semiconductor device, a high-k capping film, i.e., a single layer of metal nitride film, e.g., TiN or TSN (TiSiN), is deposited on HK film and then a Si cap layer is deposited on the high-k capping film followed by annealing, Si cap removal, and barrier layer (e.g., TaN) and gate electrode deposition over the high-k capping film. The Si deposition process could be amorphous Si deposition or fluorinated silicon deposition (FSI) i.e., F based Si, which involves F based gas soaking (e.g., $F_2$, $CF_4$, etc.) followed by Si deposition.

The capping films of metal nitride, like TiN, are more preferred over TiSiN (TSN) films since TiSiN has a Vt impact issue compared to other metal nitride films, such as widely used TiN capping films. While using a fluorinated silicon cap film, F diffuses into the capping film and the gate dielectric during annealing, which helps boost PMOS Vt and balances NMOS and PMOS Vt. The use of F incorporated Si (FSI) can help boost PMOS Vt, but it is not compatible with TiN high-k capping film, because F-rich gases damage the capping films. Therefore, a more robust capping film scheme is required to protect/shield the TiN film from F damage, oxidation damage and to boost PMOS Vt and device performance.

The present disclosure relates to the use of a thin protective shield layer to form a bilayer capping scheme for TiN to enable a fluorinated silicon cap for improving PMOS Vt, device reliability and device performance. As will be discussed in the following, the present disclosure provides devices and methods that can protect the dielectric capping film, and gate dielectric from damage from the $F_2$ soaking processes for forming fluorinated silicon cap films, protect the dielectric capping film from natural oxidation, prevent diffusion of metal of gate electrode into the gate dielectric, boost device performance and speed, lower leakage current, act as an oxygen scavenger for reducing interfacial layer regrowth (ILRG) on the gate dielectric layer, and reduce a thickness of a gate stack.

FIG. 1A shows a cross section view of a semiconductor device according to an embodiment of the present disclosure.

In some embodiments, a semiconductor device includes a gate stack 80 disposed over a channel region of a fin structure 20. The gate stack 80 includes an interfacial layer 81, a gate dielectric layer 82, a first conductive layer 83, a shield layer 84, a second conductive layer 86 as a barrier layer, a work function adjustment layer 87 and a gate electrode layer 88 as shown in FIG. 1A. In some embodiments, the fin structure 20 is provided over a substrate 10 and protrudes from an isolation insulating layer 30. Further, gate sidewall spacers 46 are disposed on opposite side faces of the gate stack 80 and one or more dielectric layers 50 are formed to cover the gate sidewall spacers 46. In some embodiments, a piece of insulating material 42 is disposed between the gate sidewall spacer 46 and the isolation insulating layer 30.

In some embodiments, the first conductive layer 83 includes a metal nitride, such as WN, TaN and TiN. In some embodiments, TiN is used. The thickness of the first conductive layer 83 is in a range from about 0.3 nm to about 30 nm in some embodiments, and is in a range from about 0.5 nm to about 25 nm in other embodiments. In some embodiments, the first conductive layer 83 is crystalline having, e.g., columnar crystal grains.

In some embodiments, the shield layer 84 is one of silicon nitride $Si_xN_y$ (where $0.3 \le x < 0.75$, $0.25 \le y \le 0.7$, and $x+y=1$), Ti, $Ti_xC_y$, $Ti_xCl_y$ (where $0.9 \le x < 0.99$, $0.01 \le y \le 0.1$, and $x+y=1$), titanium silicide (e.g., TiSi, $TiSi_2$, $Ti_3Si$, $Ti_5Si_3$, $Ti_5Si_4$ and etc.), $Ti_xSi_y$ (where $0.25 \le x < 0.99$, $0.01 \le y \le 0.75$, and $x+y=1$), $Ti_xN_y$ (where $0.3 \le x < 0.99$, $0.01 \le y \le 0.7$, and $x+y=1$), $Si_xTi_yN_z$ (where $0.01 \le x < 0.75$, $0.01 \le y \le 0.99$, $0.01 \le y \le 0.7$, and $x+y+z=1$). In some embodiments, the shield layer 84 is one of Si, $Si_xC_y$, $Si_xCl_y$ (where $0.9 \le x < 0.99$, $0.01 \le y \le 0.1$, and $x+y=1$), $Si_xN_y$ (where $0.3 \le x < 0.99$, $0.01 \le y \le 0.7$, and $x+y=1$), Ti, $Ti_xC_y$, $Ti_xCl_y$ (where $0.9 \le x < 0.99$, $0.01 \le y \le 0.1$, and $x+y=1$), titanium silicide (e.g., TiSi, $TiSi_2$, $Ti_3Si$, $Ti_5Si_3$, $Ti_5Si_4$ and etc.), $Ti_xSi_y$ (where $0.01 \le x < 0.99$, $0.01 \le y \le 0.99$, and $x+y=1$), $Ti_xN_y$ (where $0.3 \le x < 0.99$, $0.01 \le y \le 0.7$, and $x+y=1$), $Si_xTi_yN_z$ where $0.01 \le x < 0.99$, $0.01 \le y \le 0.99$, $0.01 \le y \le 0.7$, and $x+y+z=1$).

In some embodiments, the shield layer 84 is titanium silicide (e.g., TiSi, $TiSi_2$, $Ti_3Si$, $Ti_5Si_3$, $Ti_5Si_4$ and etc.), i.e. $Ti_xSi_y$ where $0.25 \le x < 0.99$, $0.01 \le y \le 0.75$, and $x+y=1$. In some embodiments where the shield layer 84 is present in a final structure, the y is not more than 0.75 and x is not less than 0.25, since such a high Si content remaining in the final device may degrade work function, device threshold voltage Vt and/or gate resistance. In some embodiments, the shield layer 84 is titanium silicide (e.g., TiSi, $TiSi_2$, $Ti_3Si$, $Ti_5Si_3$, $Ti_5Si_4$ and etc.), i.e. $Ti_xSi_y$ where $0.01 \le x < 0.99$, $0.01 \le y \le 0.99$, and $x+y=1$. In some embodiments, where the shield layer 84 is removed and not kept in a final structure, y can be more than 0.75 and as high as 0.99, in which case the shield layer is Si enriched titanium silicide or pure Si film with small amount of titanium.

In some embodiments, where the shield layer 84 is not present in a final structure, the shield layer 84 is made of one of pure Si, $Si_xC_y$, $Si_xCl_y$ (where $0.9 \le x < 0.99$, $0.01 \le y \le 0.1$, and $x+y=1$). In some embodiments where the shield layer 84 is present in a final structure, the shield layer 84 cannot be made of one of pure Si, $Si_xC_y$, $Si_xCl_y$, since such a high Si content remaining in the final device may degrade work function, device threshold voltage Vt and/or gate resistance.

In some embodiments, the shield layer 84 is silicon nitride i.e. $Si_xN_y$, where $0.3 \le x < 0.75$, $0.25 \le y \le 0.7$, and $x+y=1$. In some embodiments where the shield layer 84 is present in a final structure, the x is not more than 0.75, since such a high Si content remaining in the final device may degrade work function, device threshold voltage Vt and/or gate resistance. The upper limitation toy is due to process limitations in some embodiments. In some embodiments, the shield layer 84 is silicon nitride i.e. $Si_xN_y$, where $0.3 \leq x < 0.99$, $0.01 \leq y \leq 0.7$, and $x+y=1$. In some embodiments, where the shield layer 84 is removed and not kept in a final structure, x can be more than 0.75 in which case the shield layer is Si enriched silicon nitride or pure Si film with small amount of nitrogen. The upper limitation toy is due to process limitations in some embodiments.

In some embodiments, the shield layer 84 $Ti_xN_y$, where $0.3 \leq x < 0.99$, $0.01 \leq y \leq 0.7$, and $x+y=1$. In this case shield layer acts as a sacrificial layer to protect the underlying first conductive layer 83. In some embodiments the x is not less than 0.3 and y is not more than 0.7. The upper limitation to y is due to process limitations in some embodiments.

In some embodiments, the shield layer 84 is one of pure Ti or $Ti_xC_y$ or $Ti_xCl_y$ where $0.9 \leq x < 0.99$, $0.01 \leq y \leq 0.1$, and $x+y=1$. In this case shield layer acts as a sacrificial layer to protect the underlying first conductive layer 83. In some embodiments the x is more than 0.9 and y is not more than 0.1. The upper limitation to y is to avoid too much C, Cl impurities in final structure to reduce the gate resistance and dielectric defects. The C, Cl impurities in the $Ti_xC_y$ or $Ti_xCl_y$ film i.e. the value of y can be decreased by performing hydrogen gas soaking after film deposition.

In some embodiments, the shield layer 84 is $Si_xTi_yN_z$, where $0.01 \leq x < 0.75$, $0.01 \leq y \leq 0.99$, $0.01 \leq y \leq 0.7$, and $x+y+z=1$. In some embodiments where the shield layer 84 is present in a final structure, the x is not more than 0.75, since such a high Si content remaining in the final device may degrade work function, device threshold voltage Vt and/or gate resistance. The upper limitation toy is due to process limitations in some embodiments. In some embodiments, the shield layer 84 is $Si_xTi_yN_z$, where $0.01 \leq x < 0.99$, $0.01 \leq y \leq 0.99$, $0.01 \leq y \leq 0.7$, and $x+y+z=1$. In some embodiments, where the shield layer 84 is removed and not kept in a final structure, x can be more than 0.75 and as high as 0.99, in which case the shield layer is Si enriched film such as pure Si or silicon nitride or titanium silicide film with small amount of titanium, nitrogen. In some embodiments, x is 0, in which case the shield layer 84 is either pure Ti or TiN acting as a sacrificial layer to protect the underlying first conductive layer 83. In some embodiments, y is 0, in which the shield layer 84 is either pure Si or silicon nitride. In some embodiments, y is 1 (in other words, the shield layer 84 is pure Ti or Ti with very minute amounts of Si and/or N). In some embodiments, z is 0, in which case the shield layer 84 is titanium silicide (e.g., TiSi, $TiSi_2$, $Ti_3Si$, $Ti_5Si_3$, $Ti_5Si_4$ and etc.). The upper limitation to z is due to process limitations in some embodiments Regarding the properties of the shield layer 84, a Si rich film and/or a titanium silicide film can offer more protection against oxidation and/or fluorine damage for the underneath layers. Further, when the shield layer is a Si rich amorphous film, the shield layer 84 suppress Al diffusion more effectively due to absence of grain boundary diffusion paths. A Si rich film, on the other hand, may cause a high Vt shift issue. A Ti rich film (e.g., a low Si film) may cause less Vt impact, but may provide less protection for the underneath layers. During the deposition of the shield layer 84 and/or during the annealing operation, oxygen (O) from the oxidized first conductive layer may diffuse into the shield layer 84 and form an O rich shield layer (i.e., SiON, $SiO_x$, $SiTiNO_x$) and an O deficit first conductive layer. A Si rich shield layer provides more efficient scavenging of oxygen from the first conductive layer and more efficient interfacial layer regrowth control.

The thickness of the shield layer 84 is smaller than the thickness of the first conductive layer 83 and is in a range from about 0.1 nm to about 30 nm in some embodiments. The thickness the shield layer 84 is in a range from about 0.5 nm to about 15 nm in other embodiments. In some embodiments, a thickness T1 of the first conductive layer 83 and a thickness T2 of the shield layer 84 satisfy $0.05 \leq T2/(T1+T2) < 0.85$. A shield layer with thickness of lower than about 0.5 nm or satisfying $T2/(T1+T2) < 0.05$ may not provide sufficient protection to the first conductive layer 83 against oxidation and/or F damage, may not reduce interfacial layer regrowth (ILRG) and also may not prevent diffusion of metal of the work function adjustment layers 87 and/or of the gate electrode layer 88 into the gate dielectric layer 82. In some embodiments, $T2/(T1+T2)$ is not more than 0.85, otherwise it may degrade the work function, resistance of the device, device threshold voltage (Vt) and/or device speed performance.

The shield layer 84, the first conductive layer 83, the gate dielectric layer 82, the dielectric layer 50 and/or the gate sidewall spacers 46 contain fluorine (F) in some embodiments. Fluorine in the gate dielectric layer 82 can decrease defects, such as vacancies and dangling bonds in the gate dielectric layer 82, and improve device leakage issue and reliability. Inclusion of fluorine in the gate sidewall spacers helps to block Al diffusion from metal gate layers in to source/drain regions. However, when the amount of fluorine is too high, the fluorine may cause damage to the first conducting layer 83 and the gate dielectric layer 82, and also degrade Vt of an NMOS device (increasing NMOS Vt).

The concentration of the fluorine in the shield layer 84 is in a range from about 0.02 atomic % to about 75 atomic % in some embodiments, and is in a range from about 1 atomic % to about 25 atomic % in other embodiments. The concentration of the fluorine in the first conductive layer 83 is in a range from about 0.02 atomic % to about 55 atomic % in some embodiments and is in a range from about 1 atomic % to about 25 atomic % in other embodiments. When fluorine is included in a higher amount in the shield layer 84 and the first conductive layer 83, these layers can offer a higher effective work function, which helps to decrease Vt of a PMOS device. However, it is generally feasible for the shield layer 82 to contain fluorine more than about 75 atomic % because diffusion of fluorine into the first layer conductive layer and the gate dielectric layer. When the fluorine amount in the first conductive layer 83 is more than about 55 atomic %, it may cause loss of the first conductive layer due to formation of volatile metal fluorides, such as $TiF_x$ and $WF_x$.

The concentration of the fluorine in the gate dielectric layer 82 is in a range from about 0.01 atomic % to about 40 atomic % in some embodiments and is in a range from about 0.5 atomic % to about 10 atomic % in other embodiments. When the amount of fluorine in the gate dielectric layer 82 exceeds about 40 atomic %, it may cause damage to the gate dielectric layer 82 and decrease its effective dielectric constant due to formation of, for example, $HfF_x$.

In some embodiments, the shield layer 84 is partially amorphous or completely amorphous. The percentage of crystallinity of the shield layer 84 is in a range from about 0% (substantially completely amorphous) to about 90% in some embodiments. The percentage of crystallinity depends upon a shield layer composition and a deposition temperature in some embodiments. The percentage of crystallinity decreases with increasing the Si content (i.e., with increasing the x value) in some embodiments. The percentage of crystallinity increases with increasing the deposition temperature and with increasing a temperature of one or more subsequent annealing processes in some embodiments. The shield layer 84 helps to block the diffusion of metal (e.g., Al) from the work function adjustment layers 87 and/or the gate electrode layer 88, into the gate dielectric layer 82, in particular when the shield layer 84 is more amorphous-like film (low crystallinity). This helps to improve the gate oxide quality by reducing the Al defects in dielectric, thereby improving device leakage performance. The diffusion of metal (e.g., Al) of the gate stack into the gate dielectric layer 82 can be effectively reduced due to the amorphous nature of the shield layer 84 (absence of grain boundaries in the amorphous structure avoids grain boundary diffusion phenomenon).

The shield layer 84 can prevent thinning or loss of the first conductive layer 83 (e.g., TiN layer) during the fluorine incorporation operations in some embodiments, thereby allowing the use of F based gas without any damage to the first conductive layer 83 and/or the gate dielectric layer 82. The fluorine in the first conducting layer and/or gate dielectric layers balances threshold voltages of PMOS and NMOS of the semiconductor device, i.e., lowering PMOS threshold voltage, it also helps to decrease the trap centers in the dielectric layers, such as oxygen vacancies and/or dangling bonds, thereby improving the dielectric quality.

In some embodiments, the shield layer 84 also helps to protect the first conductive layer 83 from natural oxidation by isolating the first conductive layer 83 from atmospheric oxygen and/or moisture. In some embodiments, the shield layer 84 helps to reduce the atomic percentage of oxygen in the first conductive layer 83 from the range from about 22 atomic % to about 90 atomic % (i.e. without use of shield layer 84) to the range from about 1.5 atomic % to about 65 atomic % (i.e. with the use shield layer 84). In some embodiments, the shield layer 84 acts as an oxygen scavenger layer, i.e., the shield layer helps to capture the oxygen released from the first conductive layer 83 and/or from the gate dielectric layer 82 released during one or more subsequent annealing processes. This oxygen scavenging ability reduces the interfacial layer regrowth during the annealing, thereby decreasing interfacial layer thickness which in turn helps to boost the device speed, device Ion-Ioff performance and/or ring oscillator operating frequency performance. In some embodiments, the oxygen scavenging ability and interfacial layer regrowth control ability of the shield layer 84 can be enhanced by controlling the composition and thickness of the shield layer 84. A higher Si content (i.e., higher x value in $Si_xN_z$, $Si_xC_y$, $Si_xCl_y$, $Si_xTi_y$, $Si_xTi_yN_z$) and a greater thickness of the shield layer 84 offer more oxidation protection and more enhanced interfacial layer regrowth control in some embodiments.

Figure 1B:
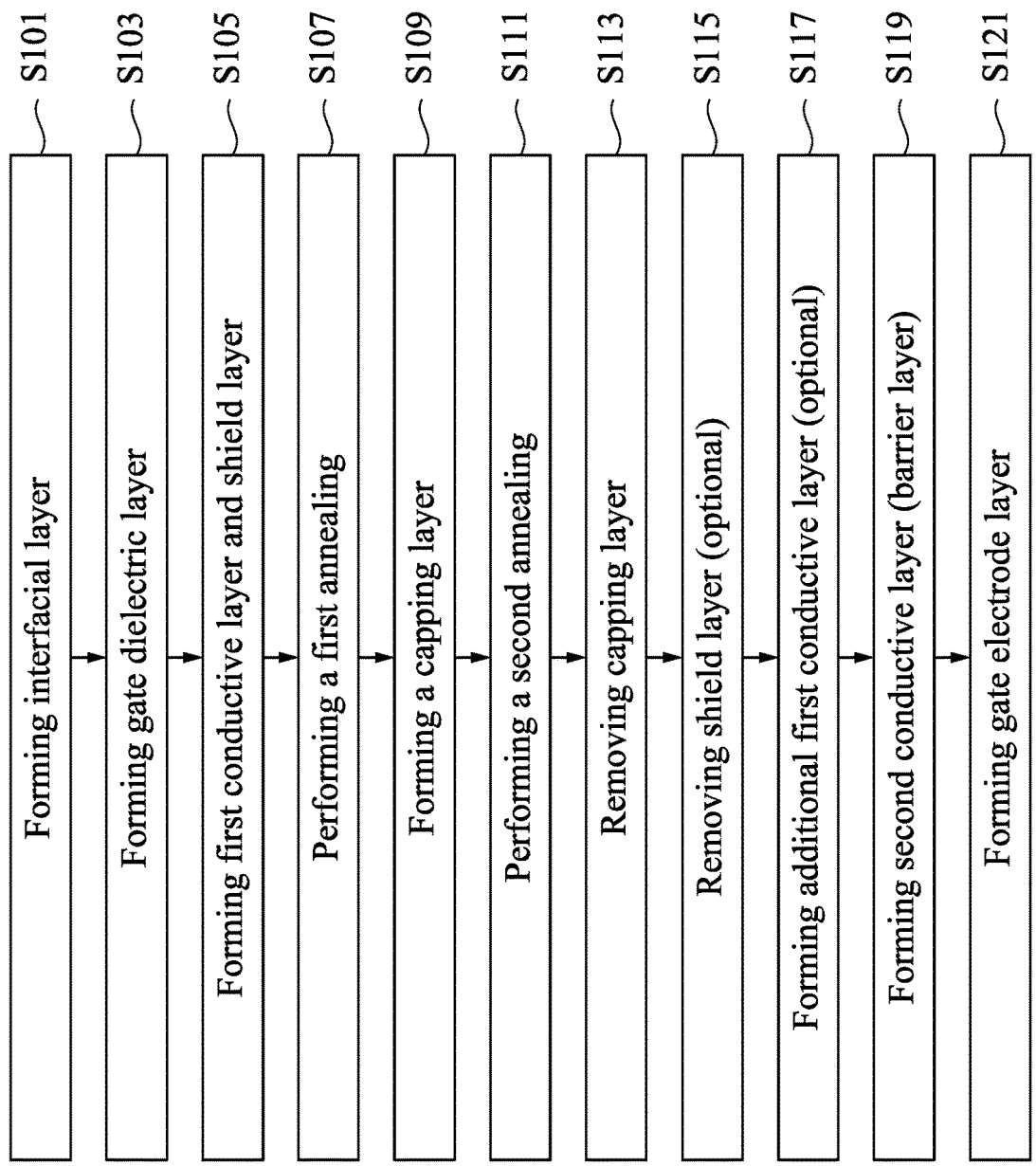
FIG. 1B shows a general process flow of manufacturing a semiconductor device according to an embodiment of the present disclosure.

FIG. 1B shows a general process flow of manufacturing a semiconductor device according to an embodiment of the present disclosure. One or more additional operations may be performed during the manufacturing flow of FIG. 1B, and some of the operations may not be performed. The order of operations may be changed. In S101 of FIG. 1B, an interfacial layer is formed over the channel region of the fin structure. In S103 of FIG. 1B, a gate dielectric layer is formed over the interfacial layer. In S105 of FIG. 1B, a first conductive layer is formed over the gate dielectric layer and a shield layer is formed over the first conductive layer. In S107 of FIG. 1B, a first annealing (e.g., post metallization annealing) is performed. In S109 of FIG. 1B, a capping layer is formed. In S111 of FIG. 1B, a second annealing (post capping annealing) is performed. In S113 of FIG. 1B, the capping layer is removed after the annealing. In S115 of FIG. 1B, the shield layer is removed in some embodiments. In other embodiments, the shield layer is not removed. In S117 of FIG. 1B, an additional first conductive layer is optionally formed to compensate the loss of the first conductive layer. In S119 of FIG. 1B, a second conductive layer is formed. In S212, a gate electrode layer including one or more work function adjustment layers and a body gate electrode layer are formed.

FIGS. 2A-3F show cross sectional views of various stages of a sequential manufacturing process of the semiconductor device according to an embodiment of the present disclosure. FIG. 3G shows a process flow of manufacturing a semiconductor device according to an embodiment of the present disclosure. It is understood that in the sequential manufacturing process, one or more additional operations can be provided before, during, and after the stages shown in FIGS. 2A-3F, and some of the operations described below can be replaced or eliminated for additional embodiments of the method. The order of the operations/processes may be interchangeable.

As shown in FIG. 2A, one or more fin structures 20 are fabricated over a substrate 10. The substrate 10 is, for example, a p-type silicon substrate with an impurity concentration in a range of about $1\times10^{15}$ cm$^{-3}$ to about $1\times10^{18}$ cm$^{-3}$. In other embodiments, the substrate 10 is an n-type silicon substrate with an impurity concentration in a range of about $1\times10^{15}$ cm$^{-3}$ to about $1\times10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 may be patterned by any suitable method. For example, the fin structures 20 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20.

As shown in FIG. 2A, two fin structures 20 extending in the Y direction are disposed adjacent to each other in the X direction. However, the number of the fin structures is not limited to two. The numbers may be one, three, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and may be in a range of about 7 nm to about 15 nm in certain embodiments. The height of the fin structure 20 is in a range of about 100 nm to about 300 nm in some embodiments, and may be in a range of about 50 nm to 100 nm in other embodiments. The space between the fin structures 20 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits. In some embodiments, the Fin FET device is an n-type Fin FET. In other embodiments, the Fin FET device is a p-type Fin FET.

After the fin structures 20 are formed, an isolation insulating layer 30 is formed over the fin structures 20, as shown in FIG. 2B.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30 and the mask layer (the pad oxide layer and the silicon nitride mask layer). The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 2B.

In certain embodiments, the partial removing of the isolation insulating layer 30 may be performed using a wet etching process, for example, by dipping the substrate in hydrofluoric acid (HF). In another embodiment, the partial removing of the isolation insulating layer 30 may be performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Then, a dummy gate structure 40 is formed over part of the fin structures 20 as shown in FIG. 2C.

A dielectric layer and a poly silicon layer are formed over the isolation insulating layer 30 and the exposed fin structures 20, and then patterning operations are performed so as to obtain a dummy gate structure including a dummy gate electrode layer 44 made of poly silicon and a dummy gate dielectric layer 42. The patterning of the poly silicon layer is performed by using a hard mask including a silicon nitride layer and an oxide layer in some embodiments. The dummy gate dielectric layer 42 may be silicon oxide formed by CVD, PVD, ALD, e-beam evaporation, or other suitable process. In some embodiments, the dummy gate dielectric layer 42 may include one or more layers of silicon oxide, silicon nitride, silicon oxy-nitride, or high-k dielectrics. In some embodiments, a thickness of the dummy gate dielectric layer is in a range of about 1 nm to about 5 nm.

In some embodiments, the dummy gate electrode layer 44 may be doped poly-silicon with uniform or non-uniform doping. In the present embodiment, the width of the dummy gate electrode layer 44 is in the range of about 30 nm to about 60 nm. In some embodiments, a thickness of the dummy gate electrode layer is in a range of about 30 nm to about 50 nm. In addition, one of more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and may be in a range of about 7 nm to about 15 nm in certain embodiments.

Further, as shown in FIG. 2C, sidewall spacers 46 are formed on opposite side faces of the dummy gate structures 40. An insulating material layer for sidewall spacers 46 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming sidewall spacers 46. In some embodiments, the sidewall spacers 46 include two to four layers of different insulating materials. In some embodiments, part of the dummy gate dielectric layer 42 is disposed between the sidewall spacers 46 and the isolation insulating layer 30. In other embodiments, no part of the dummy gate dielectric layer 42 is disposed between the sidewall spacers 46 and the isolation insulating layer 30.

Subsequently, a source/drain region of the fin structure 20 not covered by the dummy gate structure 40 is etched down (recessed) to form a source/drain recess in some embodiments. After the source/drain recess is formed, one or more source/drain epitaxial layers are formed in the source/drain recess. In some embodiments, a first epitaxial layer, a second epitaxial layer and a third epitaxial layer are formed. In other embodiments, no recess is formed and the epitaxial layers are formed over the fin structure.

In some embodiments, the first epitaxial layer includes SiP or SiCP for an n-type FinFET, and SiGe doped with B for a p-type FinFET, in the some embodiments. An amount of P (phosphorus) in the first epitaxial layer is in a range from about $1\times10^{18}$ atoms/$cm^{-3}$ to about $1\times10^{20}$ atoms/$cm^{-3}$, in some embodiments. The thickness of the first epitaxial layer is in a range of about 5 nm to 20 nm in some embodiments, and in a range of about 5 nm to about 15 nm in other embodiments. When the first epitaxial layer is SiGe, an amount of Ge is about 25 atomic % to about 32 atomic % in some embodiments, and is about 28 atomic % to about 30 atomic % in other embodiments. The second epitaxial layer includes SiP or SiCP for an n-type FinFET, and SiGe doped with B for a p-type FinFET, in some embodiments. In some embodiments, an amount of phosphorus in the second epitaxial layer is higher than the phosphorus amount of the first epitaxial layer and is in a range about $1\times10^{20}$ atoms/$cm^{-3}$ to about $2\times10^{20}$ atoms/$cm^3$. The thickness of the second epitaxial layer is in a range of about 20 nm to 40 nm in this embodiment, or in a range of about 25 nm to about 35 nm in other embodiments. When the second epitaxial layer is SiGe, an amount of Ge is about 35 atomic % to about 55 atomic % in some embodiments, and is about 41 atomic % to about 46 atomic % in other embodiments. The third epitaxial layer may include a SiP epitaxial layer. The third epitaxial layer is a sacrificial layer for silicide formation in the source/drain. An amount of phosphorus in the third epitaxial layer is less than the phosphorus amount of the second epitaxial layer and is in a range of about $1\times10^{18}$ atoms/$cm^3$ to about $1\times10^{21}$ atoms/$cm^3$ in some embodiments. When the third epitaxial layer is SiGe, an amount of Ge is less than about 20 atomic % in some embodiments, and is about 1 atomic % to about 18 atomic % in other embodiments.

In at least one embodiment, the epitaxial layers are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using silicon source gas such as $SiH_4$, $Si_2H_6$, or $Si_3H_8$; germanium source gas such as $GeH_4$, or $G_2H_6$; carbon source gas such as $CH_4$ or $SiH_3CH_3$ and phosphorus source gas such as $PH_3$.

Then, as shown in FIG. 2C, an interlayer dielectric (ILD) layer 50 is formed over the S/D epitaxial layer and the dummy gate structure 40. The materials for the ILD layer 50 include compounds comprising Si, O, C and/or H, such as silicon oxide, SiCOH and SiOC. Organic materials, such as polymers, may be used for the ILD layer 50.

After the ILD layer 50 is formed, a planarization operation, such as CMP, is performed, so that the top portion of the dummy gate electrode layer 44 is exposed, as shown in FIG. 2C. In some embodiments, before the ILD layer 50 is formed, a contact etch stop layer, such as a silicon nitride layer or a silicon oxynitride layer, is formed.

Then, the dummy gate electrode layer 44 and the dummy gate dielectric layer 42 are removed, thereby forming a gate space 47 as shown in FIG. 2D. The dummy gate structures can be removed using plasma dry etching and/or wet etching. When the dummy gate electrode layer 44 is polysilicon and the ILD layer 40 is silicon oxide, a wet etchant such as a TMAH solution can be used to selectively remove the dummy gate electrode layer 44. The dummy gate dielectric layer 42 is thereafter removed using plasma dry etching and/or wet etching.

Figure 3C:
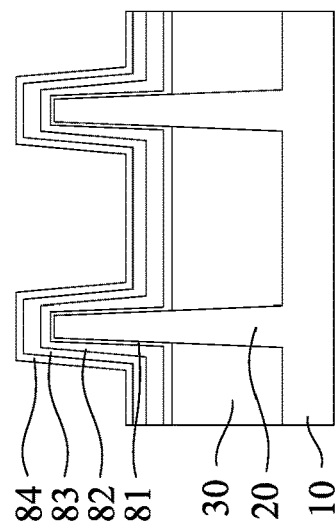
FIGS. 3A, 3B, 3C, 3D, 3E and 3F show cross sectional views of various stages of a sequential manufacturing process of a semiconductor device according to an embodiment of the present disclosure.
Figure 3F:
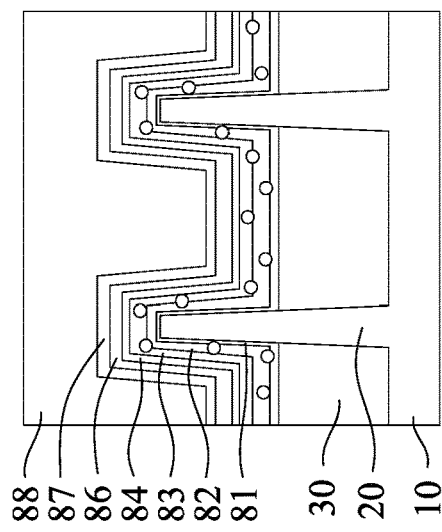
Figure 3B:
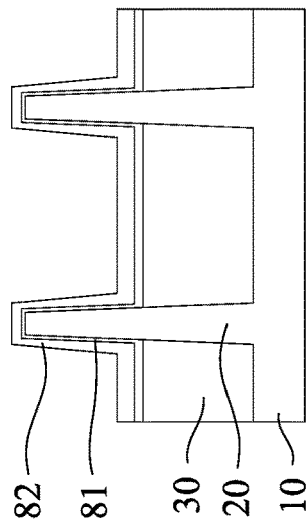
Figure 3E:
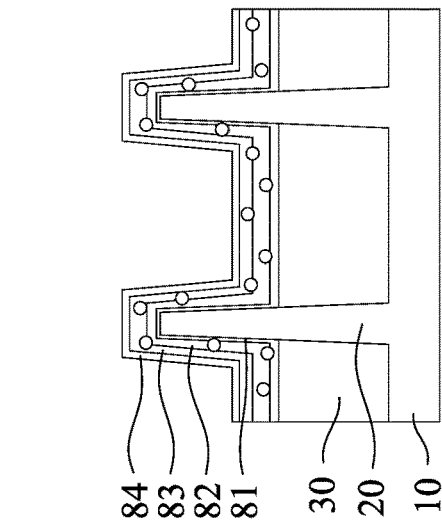
Figure 3A:
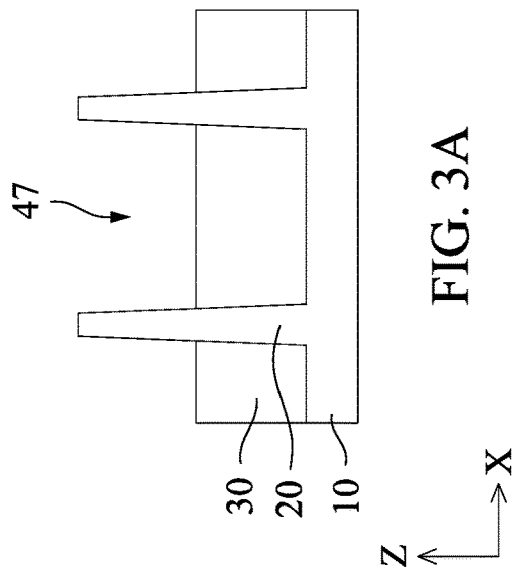

FIG. 3A shows the structure after the channel region of the fin structures 20 are exposed in the gate space 47. In FIGS. 3A-3F, the sidewall spacers 46 and the ILD layer 50 are omitted.

Figure 3D:
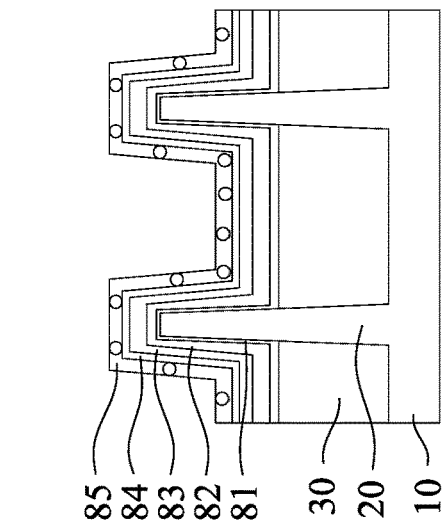
Figure 3G:
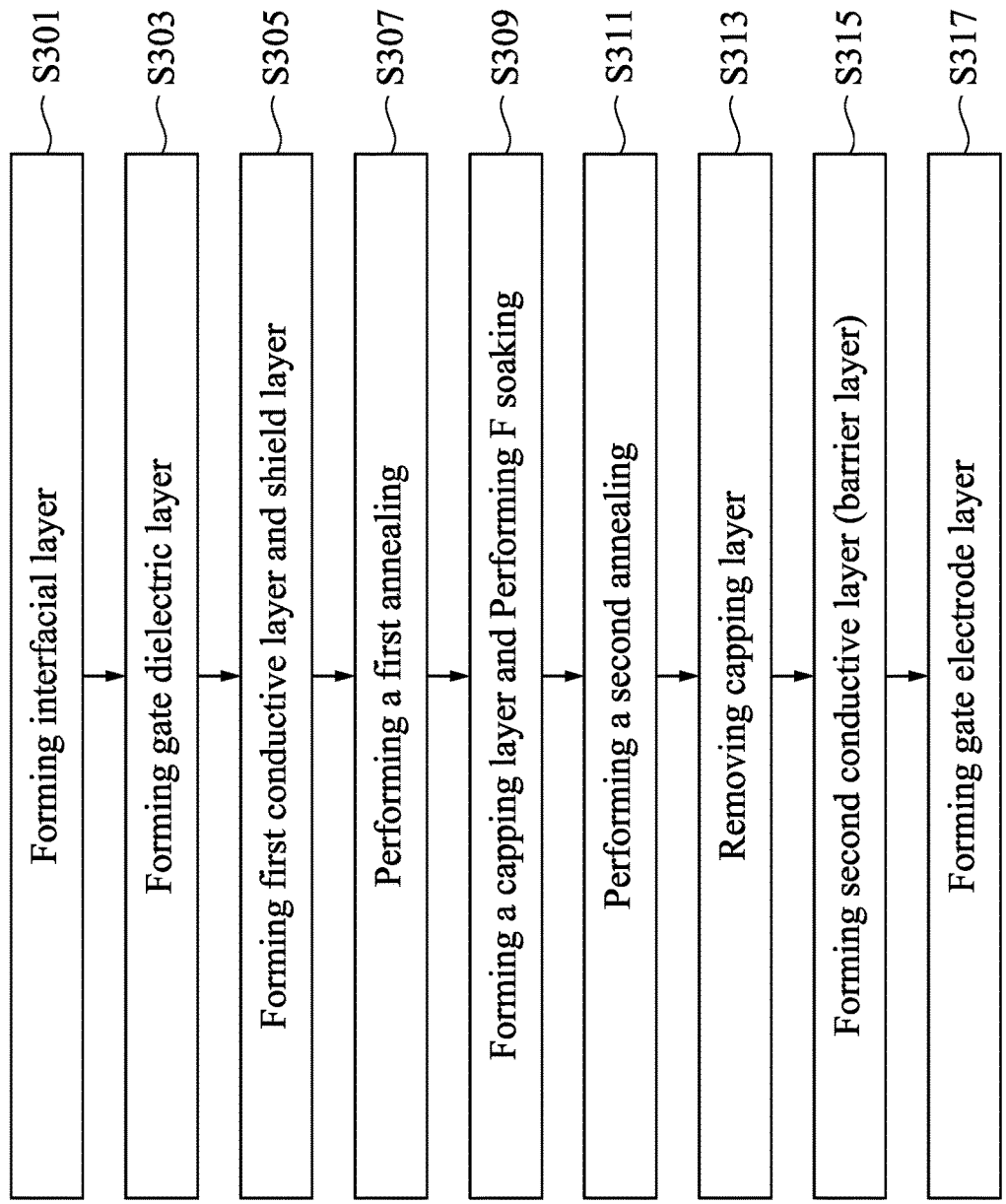
FIG. 3G shows a process flow of manufacturing a semiconductor device according to an embodiment of the present disclosure.

As shown in FIG. 3B, at S301 of FIG. 3G, an interfacial layer 81 is formed on the fin structure 20 and, at S303 of FIG. 3G, a gate dielectric layer 82 is formed on the interfacial layer 81. In some embodiments, the interfacial layer is formed by using chemical oxidation. In some embodiments, the interfacial layer 81 includes one of silicon oxide, silicon nitride and mixed silicon-germanium oxide. The thickness of the interfacial layer 81 is in a range from about 0.2 nm to about 6 nm in some embodiments. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$ or other suitable high-k dielectric materials, and/or combinations thereof. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 100 nm in one embodiment.

Then, as shown in FIG. 3C, at S305 of FIG. 3G, a first conductive layer 83 and a shield layer 84 are formed. The first conductive layer 83 and the shield layer 84 can be formed by CVD, ALD or any suitable method in some embodiments. In some embodiments, the shield layer 84 is formed subsequent to the formation of the first conductive layer 83 without breaking vacuum, so that any contamination from atmosphere or oxidation of the film can be avoided. In other embodiments, the shield layer 84 is formed subsequent to the formation of the first conductive layer 83 with breaking vacuum.

In some embodiments, the shield layer 84 is made of one of Si, silicon nitride, titanium silicide (e.g., TiSi, $TiSi_2$, $Ti_3Si$, $Ti_5Si_3$, $Ti_5Si_4$ and etc.), SiC, SiCl, Ti, TiC, TiCl, TiN and SiTiN. In some embodiments, the shield layer is formed by CVD, ALD or any other suitable film formation methods. In some embodiment, the shield layer 84 is formed using a highly conformal deposition process, such as ALD, in order to ensure the formation of the shield layer 84 having a substantially uniform thickness over the first conductive layer 83 of each channel layer. In other embodiments, the shield layer 84 is formed by high temperature thermal decomposition, chemical reaction of precursors of Si and/or precursors of Ti and/or precursors of N. In some embodiments, a Si source (precursor) includes one or more of silane ($SiH_4$), disilane ($Si_2H_6$), dichlorosilane ($SiH_2Cl_2$), hexachlorodisilane ($Si_2Cl_6$), dimethyl dichlorosilane ($Si(CH_3)_2Cl_2$), TEOS (Si $(OC_2H_5)_4$, trichlorosilane ($SiHCl_3$), trichloro disilane ($Si_2H_3Cl_3$), hexa-methyl disilane (($Si(CH_3)_3)_2$, and tetra-ethyl silane ($Si(C_2H_5)_4$). In some embodiments, a Ti source (precursor) is one or more of titanium tetrachloride ($TiCl_4$), tetrakis-dimethylamidotitanium ($Ti(N(CH_3)_2)_4$, and tris(dimethylamido)-(dimethylamino-2-propanolato)titanium ($Ti(NMe_2)_3$(dmap)). In some embodiments, a nitrogen source (precursor) is one or more of ammonia ($NH_3$), hydrazine ($N_2H_4$), and $N_2$. In some embodiments, an atomic layer deposition (ALD) is used. In some embodiments, the film formation temperature is in a range from about 250° C. to about 600° C. and in other embodiments, is in a range from about 400° C. to 500° C. In some embodiments, the film formation process pressure is in a range from about 1 Torr to about 150 Torr.

FIGS. 4A, 4B, 4C and 4D show various gas supplying timings for ALD operations to form a SiTiN layer for the shield layer 84. FIGS. 4E, 4F, 4G and 4H show various gas supplying timings for ALD operations to form a SiN, Ti, Si, TiSi layer respectively for the shield layer 84. In some embodiments, CVD is used with the illustrated gas supplying timings.

In an embodiment shown in FIG. 4A, the ALD is performed by a first cycle of supplying a Ti precursor (e.g., TiCl$_4$) and a N precursor "N Pc" (e.g., NH$_3$), and a second cycle of supplying a Si precursor "Si Pc" (e.g., SiH$_4$) and a N precursor, and the first cycle is repeated m times (m=1, 2, 3, . . . ), and the second cycle is repeated n times (n=1, 2, 3, . . . ). Thus, supplying precursors of Ti, N, Si and N in this order is repeated. A purge gas (e.g. Ar) purge is supplied to purge excess precursor when changing the precursor.

In an embodiment shown in FIG. 4B, the ALD is performed by supplying a Si precursor, a Ti precursor and a N precursor in this order, which may be repeated twice of more. Thus, supplying precursors of Si, Ti and N in this order is repeated. A purge gas is supplied when changing the precursor. The order of gas supply may change.

In an embodiment shown in FIG. 4C, the ALD is performed by supplying a Ti precursor, a Si precursor and a N precursor in this order, which may be repeated twice of more. Thus, supplying precursors of Ti, Si and N in this order is repeated. A purge gas is supplied when changing the precursor. The order of gas supply may change.

In an embodiment shown in FIG. 4D, the ALD is performed by supplying a Ti precursor and a mixed gas of a Si precursor and a N precursor in this order, which may be repeated twice of more. Thus, supplying precursors of Ti and a mixture of Si and N in this order is repeated. A purge gas is supplied when changing the precursor. The order of gas supply may change.

In an embodiment shown in FIG. 4E, the ALD for a SiN layer is performed by supplying a Si precursor and a N precursor, which may be repeated twice of more. Thus, supplying precursors of Si and N in this order is repeated. One or more purge operations by the purge gas are performed when changing the precursor.

In an embodiment shown in FIG. 4F, the ALD for a Ti layer is performed by supplying a Ti precursor and a purge gas including at least one of Ar or H$_2$ gas, which may be repeated twice of more.

In an embodiment shown in FIG. 4G, the ALD for a Si layer is performed by supplying a Si precursor and a purge gas, which may be repeated twice of more.

In an embodiment shown in FIG. 4H, the ALD for a TiSi layer is performed by supplying a Ti precursor and a Si precursor in this order, which may be repeated twice of more. A purge gas is supplied when changing the precursor. The order of gas supply may change.

In some embodiments, at S307 of FIG. 3G, after the shield layer 84 is formed, a first annealing operation is performed for about 1 nsec (spike annealing, such as a laser annealing) to about 360 sec at a temperature of about 600° C. to about 800° C. in some embodiments.

The first annealing can help to densify the gate dielectric layer 82 and to incorporate nitrogen into the gate dielectric layer 82. Nitrogen helps to passivate oxygen vacancies, reduces leakage and improve device reliability. The first annealing can also help to form a stable intermixing layer, which helps to provide a stable platform for subsequent metal gate film deposition onto the dielectric layer. When the temperature is too high, the first annealing may cause crystallization and grain boundary formation in the high-k gate dielectric layer 82, which impacts leakage performance and regrowth of the interfacial layer 81, which slows down device speed. In contrast, when the temperature is too low, the first annealing may not provide sufficient densification in the high-k gate dielectric layer and cause device instability/ variations during subsequent metal gate deposition processes.

Subsequently, the stacked structure including the interfacial layer 81, the gate dielectric layer 82, the first conductive layer 83 and the shield layer 84 is soaked in a fluorine containing gas (e.g., F$_2$ and/or NF$_3$) for about 4 sec to about 15 min at a temperature of about room temp (25° C.) to about 550° C. in some embodiments. As set forth above, incorporation of fluorine helps to improve work function adjustment property, decrease Vt of a PMOS device, to passivate oxygen vacancies in the gate dielectric layer 82, to reduce leakage and to reduce dangling bonds in the gate dielectric layer. On the other hand, fluorine soaking may cause some damage to the first conductive layer 85 (e.g., etching by F precursor gases) and/or the gate dielectric layer (e.g., decrease in a dielectric constant). The use of the shield layer 84 can suppress or avoid these problems.

Thereafter, at S309 of FIG. 3G, a capping layer 85, e.g., a crystalline, polycrystalline or amorphous Si layer, is formed over the shield layer 84, as shown in FIG. 3D, and at S311 of FIG. 3G, a second annealing operation is performed for about 1 nsec (spike annealing, such as a laser annealing) to about 360 sec at a temperature of about 550° C. to about 1300° C. in some embodiments. In some embodiments, the temperature is from 900° C. to 1100° C. This results in the diffusion of the fluorine into the capping layer 85, the shield layer 84, the first conductive layer 83 and the gate dielectric layer 82 in some embodiments. At S313 of FIG. 3G, after the second annealing operation, the capping layer 85 is removed as show in FIG. 3E.

The second annealing with the Si capping layer 85 also helps to improve the quality of the gate dielectric layer 82. A gate dielectric layer, such as a high-k dielectric layer, is formed at a relatively low temperature to avoid crystallization and grain boundary formation, while metal gate films are deposited at relatively higher temperatures. Accordingly, it is desirable to make the high-k dielectric layer to more thermally stable before the metal gate deposition. The second annealing with the capping layer 85 at the temperature ranges as set forth above can densify the high-k dielectric layer, and make it thermally stable, without any thermal oxide inversion during the metal gate deposition. The second annealing also helps to thermally in-diffuse the fluorine from the outer layers (e.g., the capping layer and the shield layer) into the first conductive layer 85, the gate dielectric layer 82 and the interfacial layer 81. The capping layer 85 is used to protect the gate dielectric layer 82 and the first conductive layer 83 from undesirable oxidation damage and to isolate these films from the annealing atmosphere. After thermal stabilization of the gate dielectric layer, the capping layer 85 is no longer required in the final device structure and therefore it is removed.

Subsequently, at S315 of FIG. 3G, the barrier layer 86 is formed, and then at S317 of FIG. 3G, the gate metal layers including one or more work function adjustment layers 87 and a body metal layer (gate electrode layer) 88 are formed above the shield layer 84.

In some embodiments, the barrier layer 86 is made of TaN and serves as an etch stop barrier layer. The barrier layer 86 acts as a wet etching stop layer during patterning of p-type and n-type work function adjustment layers subsequently formed to form multiple Vt devices. In some embodiments, a p-type work function adjustment layer is removed from an n-type device region, while the p-type work function adjustment layer remains on another PMOS.

In some embodiments, the work function adjustment layer 87 is made of a conductive material such as a single layer of TiN, WN, TaAlC, TiC, TaC, Co, Al, TiAl, or TiAlC, or a multilayer of two or more of these materials. For the n-channel FET, one or more of TaN, TaAlC, TiN, TiC, Co, or TiAl is used as the work function adjustment layer, and for the p-channel FET, one or more of TiAlC, Al, TiAl, TaN, TaAlC, TiN, WN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers. In some embodiments, the work function adjustment layer 87 is deposited and selectively removed from some transistors by using one or more lithography and etching operations.

The gate electrode layer (body metal layer) 88 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The body metal layer 88 may be formed by CVD, ALD, electro-plating, or other suitable method.

The order of the fluorine soaking and the formation of the capping layer (e.g. Si capping layer) 85 is not limited to the above order. In some embodiments, the fluorine soaking is performed prior to the formation of the Si capping layer 85, the fluorine soaking is simultaneously performed with the formation of the capping layer 85, i.e., fluorination soaking during the Si capping layer deposition by introducing $F_2$ gas at a temperature, for example, in a range from about 300° C. to about 450° C., or the fluorine soaking is performed after the formation of Si capping layer 85.

Figure 5:
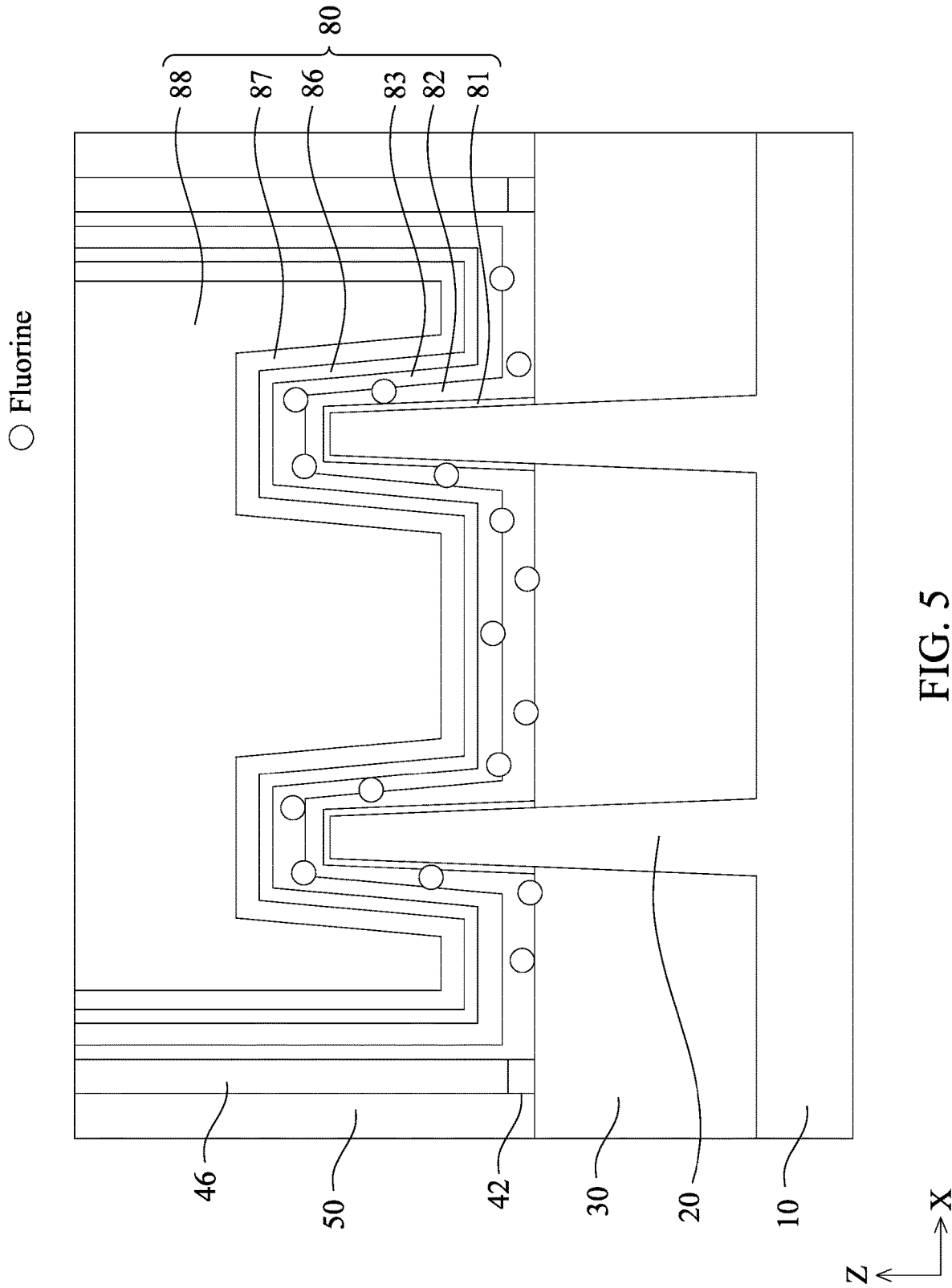
FIG. 5 shows a cross section view of a semiconductor device according to an embodiment of the present disclosure.
Figure 6A:
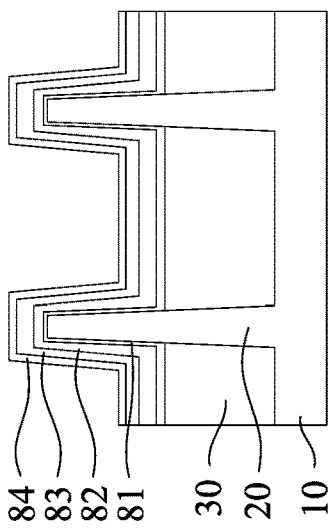
FIGS. 6A, 6B, 6C, 6D, 6E and 6F show cross sectional views of various stages of a sequential manufacturing process of a semiconductor device according to an embodiment of the present disclosure.
Figure 6B:
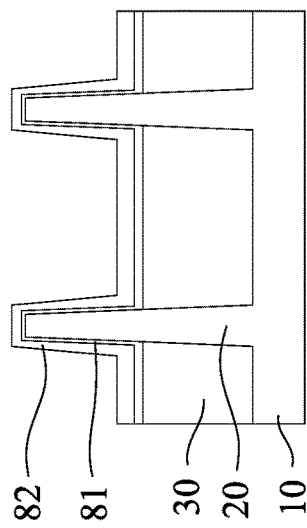
Figure 6C:
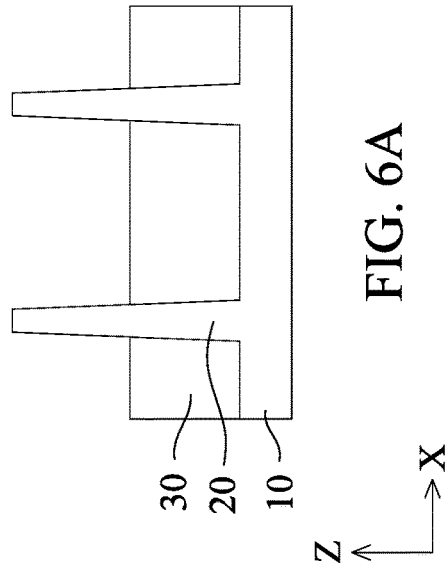
Figure 6D:
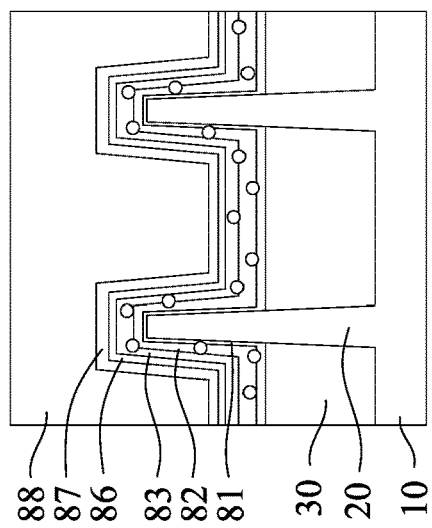
Figure 6E:
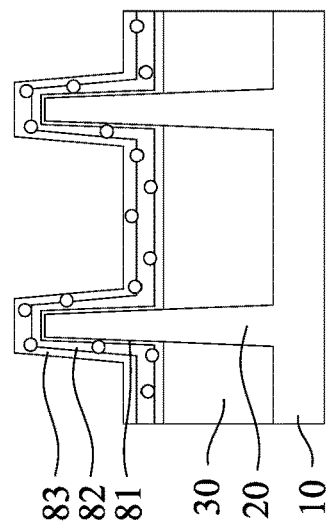
Figure 6F:
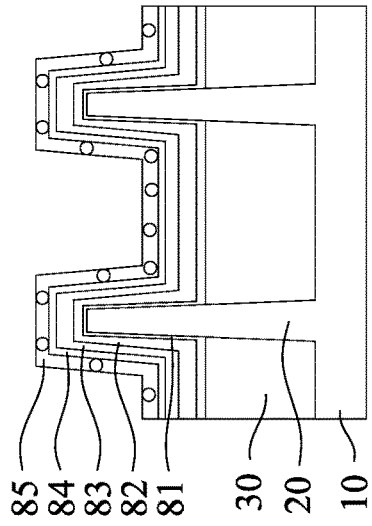
Figure 6G:
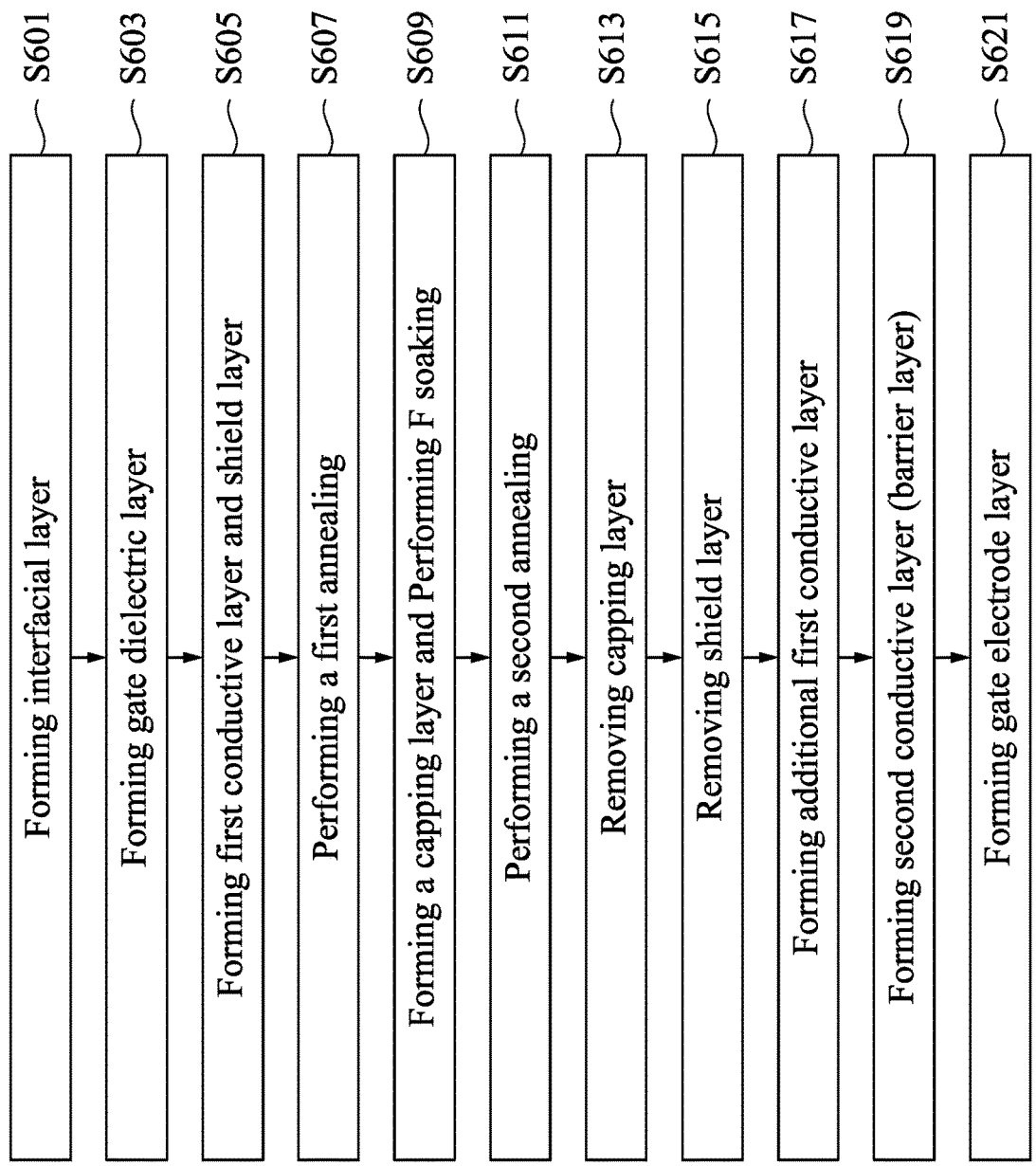
FIG. 6G shows a process flow of manufacturing a semiconductor device according to an embodiment of the present disclosure.

FIG. 5 shows a cross section view of a semiconductor device according to an embodiment of the present disclosure. FIGS. 6A-6F show cross sectional views of various stages of a sequential manufacturing process of the semiconductor device of FIG. 5 according to an embodiment of the present disclosure. FIG. 6G shows a process flow of manufacturing a semiconductor device according to an embodiment of the present disclosure. It is understood that in the sequential manufacturing process, one or more additional operations can be provided before, during, and after the stages shown in FIGS. 6A-6F, and some of the operations described below can be replaced or eliminated for additional embodiments of the method. The order of the operations/processes may be interchangeable. Materials, configurations, dimensions, processes and/or operations as described with respect to the foregoing embodiments may be employed in the following embodiment, and detailed description thereof may be omitted.

In this embodiment, the final semiconductor device structure includes no shield layer as shown in FIG. 5. In some embodiments, the shield layer 84 includes $Si_xTi_yN_z$, where $0 \leq x < 1$, $0 \leq y \leq 1$, $0 \leq z \leq 0.7$. In other embodiments, the shield layer 84 is made of Si. In other embodiments, the shield layer 84 is made of one of silicon nitride, Ti, titanium nitride, titanium silicide (e.g., TiSi, $TiSi_2$, $Ti_3Si$, $Ti_5Si_3$, $Ti_5Si_4$ and etc.).

The operations S601, S603, S605, S607, S609, S611, and S613 of FIG. 6G and FIGS. 6A-6D are the same as the operations S301, S303, S305, S307, S309, S311, and S313 of FIG. 3G and FIGS. 3A-3D, respectively. As shown in FIG. 6E, after the capping layer 85 is removed, at S 615 of FIG. 6G, the shield layer 84 is also removed. Then, at S619 and S621 of FIG. 6G, as shown in FIG. 6F, a barrier layer 86, one or more work function adjustment layers 87 and a gate electrode layer 88 are formed. In some embodiments, the shield layer 84 is removed after the first annealing operation and prior to the capping layer 85 deposition. In some embodiments, the shield layer 84 is removed after the second annealing and after the capping layer removal operation. In some embodiments, the shield layer 84 is removed simultaneously during the removal operation of the capping layer 85. The shield layer 84 can be removed by dry etching and/or by wet etching chemicals (e.g. the combination of HCl, $NH_4OH$, $H_2O_2$ and deionized water) at a temperature ranging from about 25° C. to about 200° C. In some embodiments where the shield layer 84 is removed after the first annealing operation, the interfacial layer regrowth reduction by about 0.13 nm (i.e. about 0.13 nm less than the as formed interfacial layer thickness) is observed. In some embodiments where the shield layer is removed after the first annealing operation, the interfacial layer regrowth reduction by about 0.2 nm to 0.4 nm (i.e. about 0.2 nm to 0.4 nm less than the as formed interfacial layer thickness) is observed. In some embodiments, at S617 of FIG. 6G, after shield layer 84 is removed and before the barrier layer and or the second conductive layer is deposited, the first conducting layer 83 is redeposited to recover the first conductive layer loss or damage during the shield layer removal operation.

Figure 7:
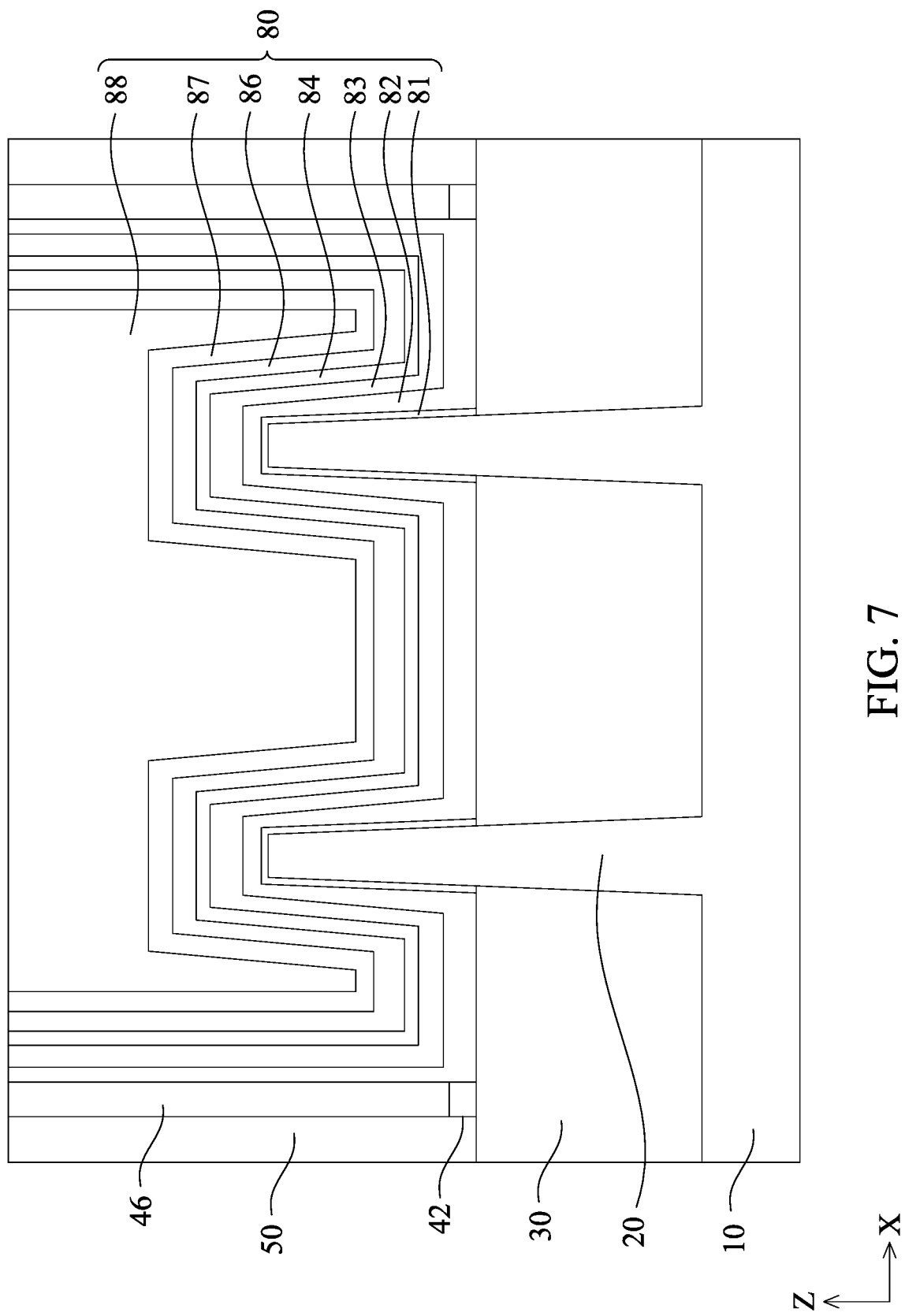
FIG. 7 shows a cross section view of a semiconductor device according to an embodiment of the present disclosure.
Figure 8C:
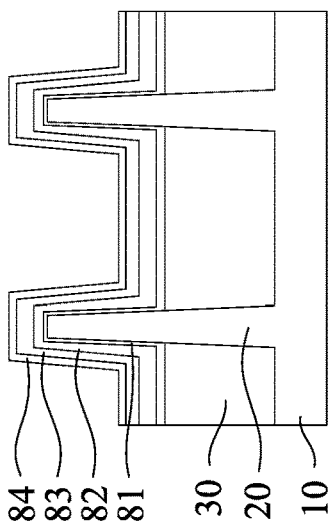
FIGS. 8A, 8B, 8C, 8D, 8E and 8F show cross sectional views of various stages of a sequential manufacturing process of a semiconductor device according to an embodiment of the present disclosure.
Figure 8B:
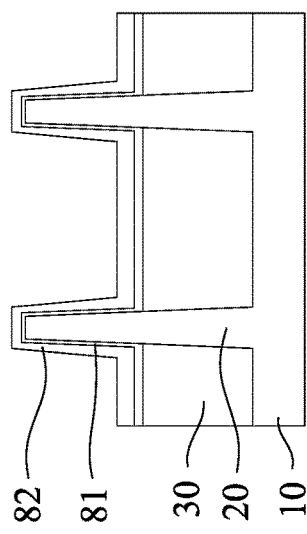
Figure 8A:
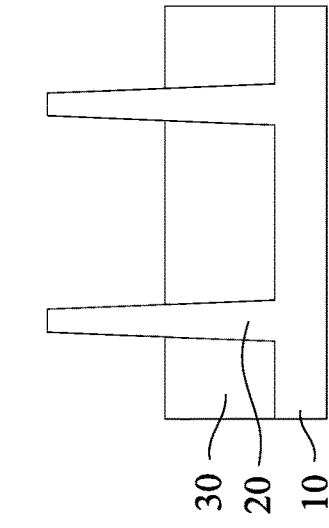
Figure 8F:
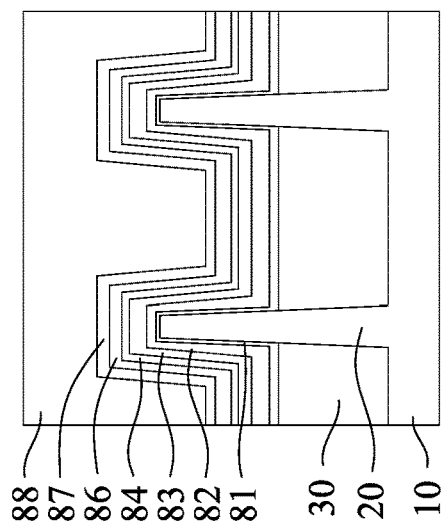
Figure 8E:
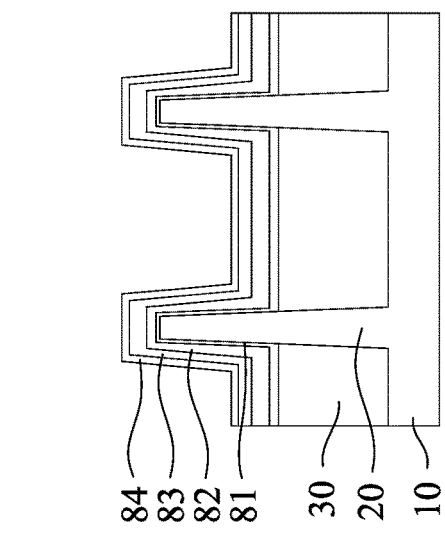
Figure 8D:
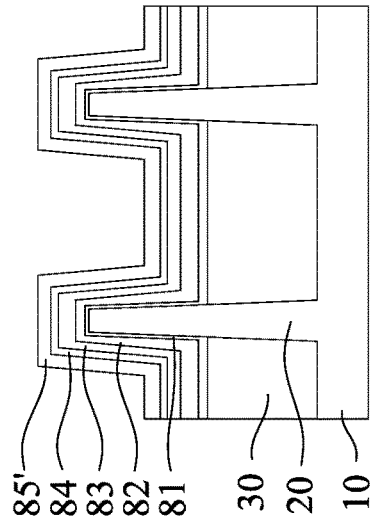
Figure 8G:
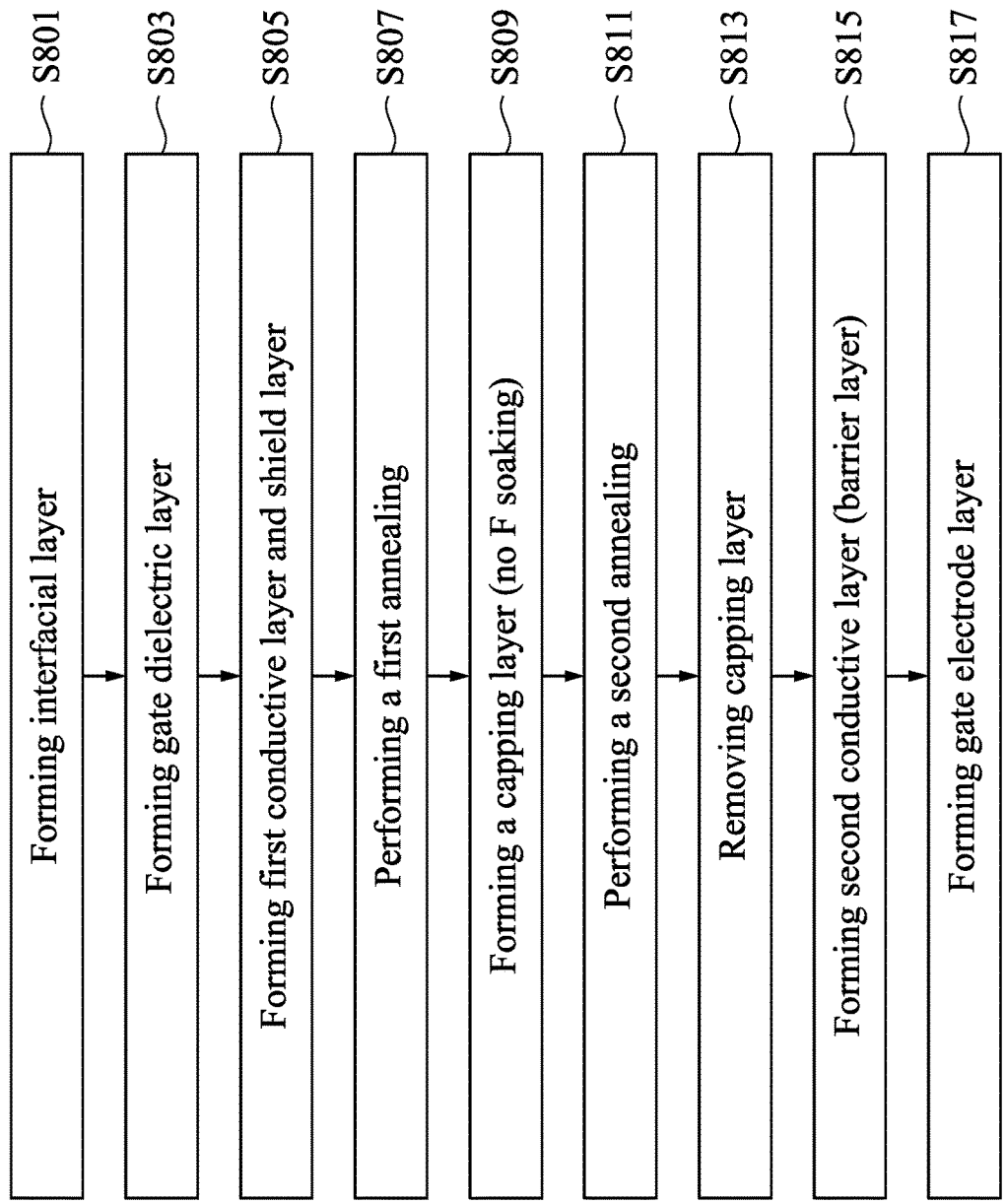
FIG. 8G shows a process flow of manufacturing a semiconductor device according to an embodiment of the present disclosure.

FIG. 7 shows a cross section view of a semiconductor device according to an embodiment of the present disclosure. FIGS. 8A-8F show cross sectional views of various stages of a sequential manufacturing process of the semiconductor device of FIG. 7 according to an embodiment of the present disclosure. FIG. 8G shows a process flow of manufacturing a semiconductor device according to an embodiment of the present disclosure. It is understood that in the sequential manufacturing process, one or more additional operations can be provided before, during, and after the stages shown in FIGS. 8A-8F, and some of the operations described below can be replaced or eliminated for additional embodiments of the method. The order of the operations/processes may be interchangeable. Materials, configurations, dimensions, processes and/or operations as described with respect to the foregoing embodiments may be employed in the following embodiment, and detailed description thereof may be omitted.

In this embodiment, no fluorine soaking is performed, and thus the gate structure and the channel regions of the semiconductor device are free from fluorine, as shown in FIG. 7. In some embodiments, the shield layer 84 includes one of $Si_xN_y$ (where $0.3 \leq x < 0.75$, $0.25 \leq y \leq 0.7$, and $x+y=1$), Ti, $Ti_xC_y$ (where $0.9 \leq x < 0.99$, $0.01 \leq y \leq 0.1$, and $x+y=1$), $Ti_xCl_y$ (where $0.9 \leq x < 0.99$, $0.01 \leq y \leq 0.1$, and $x+y=1$), titanium silicide, $Ti_xSi_y$ (where $0.25 \leq x < 0.99$, $0.01 \leq y \leq 0.75$, and $x+y=1$), $Ti_xN_y$ (where $0.3 \leq x < 0.99$, $0.01 \leq y \leq 0.7$, and $x+y=1$), $Si_xTi_yN_z$ (where $0.01 \leq x < 0.75$, $0.01 \leq y \leq 0.99$, $0.01 \leq y \leq 0.7$, and $x+y+z=1$).

The operations of S801, S803 and S805 of FIG. 8G and FIGS. 8A-8C are the same as the operations of S301, S303 and S305 of FIG. 3G and FIGS. 3A-3C, respectively. As shown in FIG. 8D, after the first conductive layer 83 and the shield layer 84 are formed and a first annealing operation is performed at S807 of FIG. 8G, at S809 of FIG. 8G, a capping layer 85 is formed without performing a fluorine soaking operation, as shown in FIG. 8D. After a second annealing operation is performed at S811 of FIG. 8G, at S813 of FIG. 8G, the capping layer 85 is removed, while the shield layer 84 is not removed, as shown in FIG. 8E. Then, as shown in FIG. 8F, a second conductive layer 86 is formed at S815 of FIG. 8G, and one or more work function adjustment layers 87 and a gate electrode layer 88 are formed at S817 of FIG. 8G.

Figure 9:
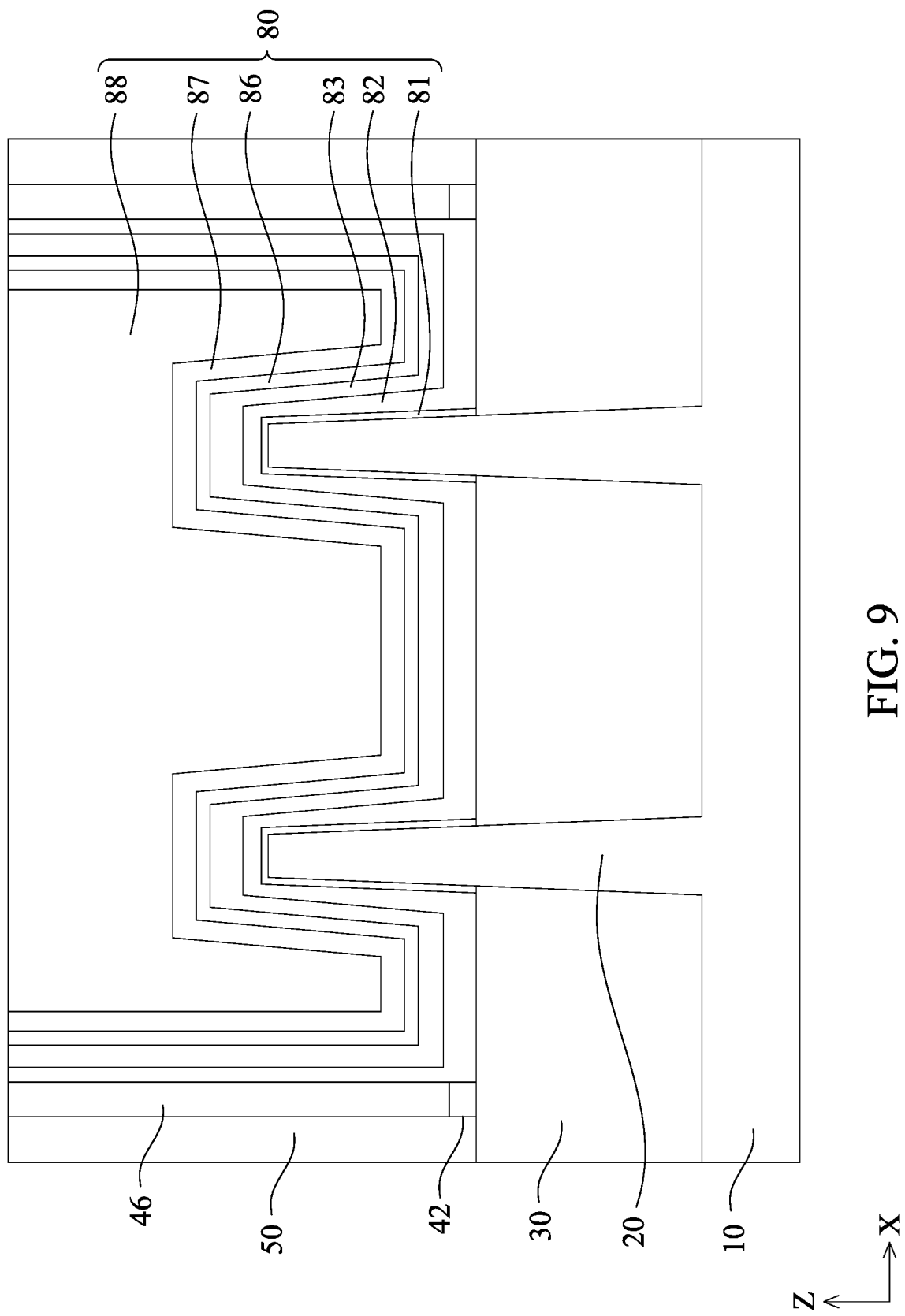
FIG. 9 shows a cross section view of a semiconductor device according to an embodiment of the present disclosure.
Figure 10C:
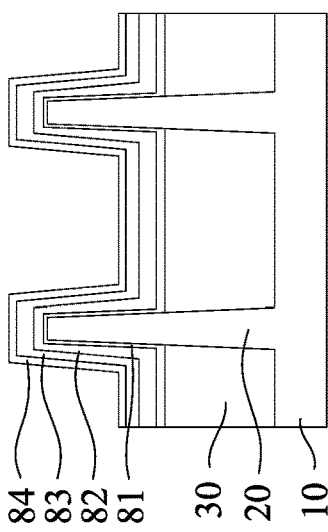
FIGS. 10A, 10B, 10C, 10D, 10E and 10F show cross sectional views of various stages of a sequential manufacturing process of a semiconductor device according to an embodiment of the present disclosure.
Figure 10B:
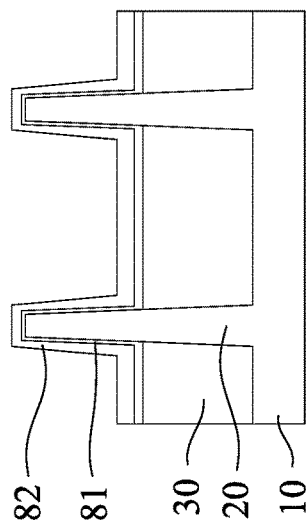
Figure 10A:
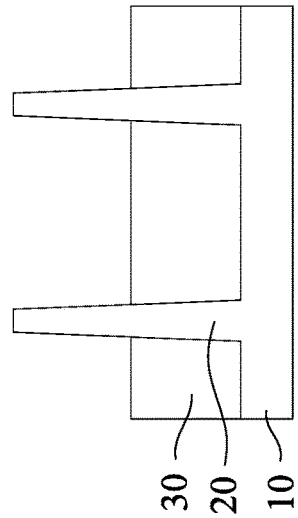
Figure 10F:
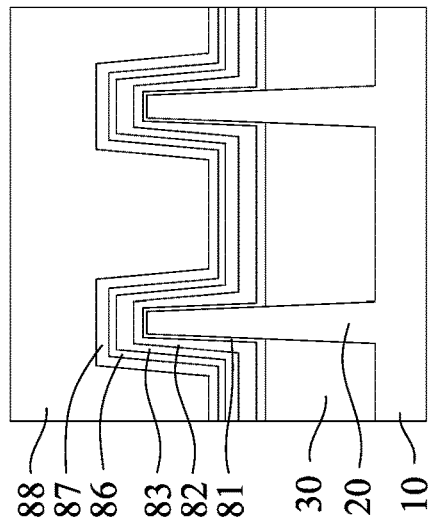
Figure 10E:
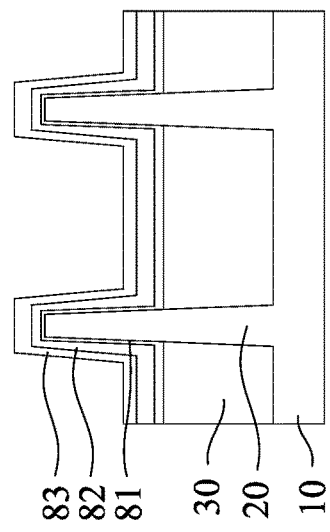
Figure 10D:
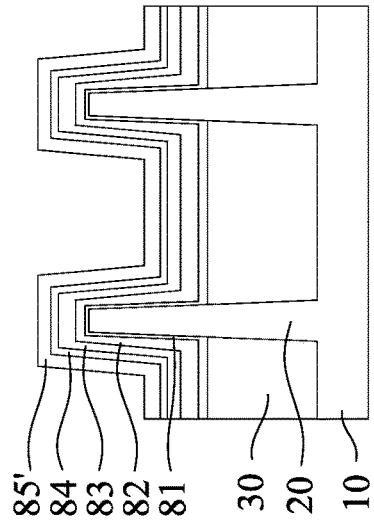
Figure 10G:
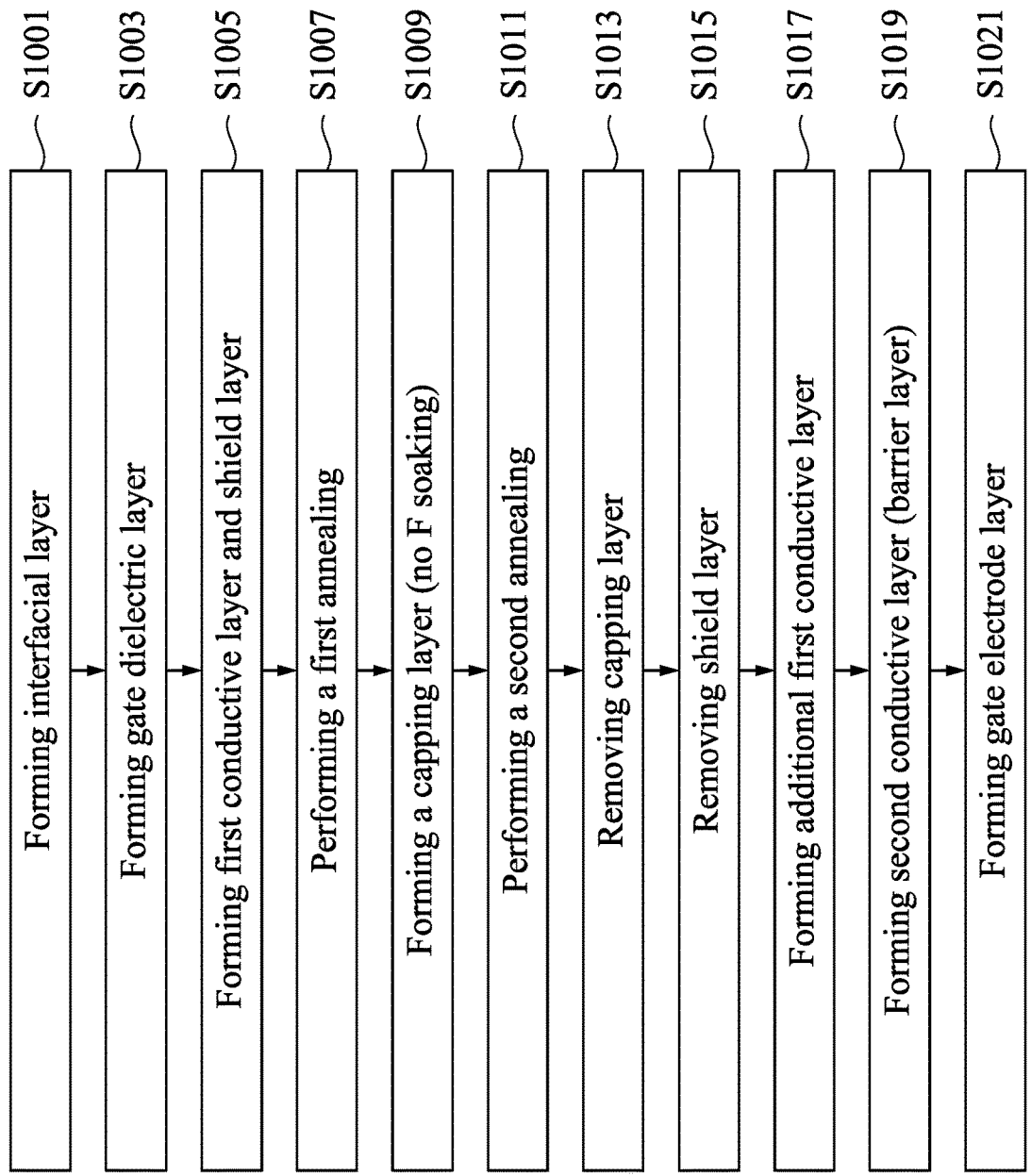
FIG. 10G shows a process flow of manufacturing a semiconductor device according to an embodiment of the present disclosure.

FIG. 9 shows a cross section view of a semiconductor device according to an embodiment of the present disclosure. FIGS. 10A-10F show cross sectional views of various stages of a sequential manufacturing process of the semiconductor device of FIG. 9 according to an embodiment of the present disclosure. FIG. 10G shows a process flow of manufacturing a semiconductor device according to an embodiment of the present disclosure. It is understood that in the sequential manufacturing process, one or more additional operations can be provided before, during, and after the stages shown in FIGS. 10A-10F, and some of the operations described below can be replaced or eliminated for additional embodiments of the method. The order of the operations/processes may be interchangeable. Materials, configurations, dimensions, processes and/or operations as describe with respect to the foregoing embodiments may be employed in the following embodiment, and detailed description thereof may be omitted.

In this embodiment, no fluorine soaking is performed and no shield layer is included in the final gate structure, as shown in FIG. 9. In some embodiments, the shield layer 84 includes one of Si, $Si_xC_y$, $Si_xCl_y$ (where $0.9 \leq x < 0.99$, $0.01 \leq y \leq 0.1$, and x+y=1), $Si_xN_y$ (where $0.3 \leq x < 0.99$, $0.01 \leq y \leq 0.7$, and x+y=1), Ti, $Ti_xC_y$, $Ti_xCl_y$ (where $0.9 \leq x < 0.99$, $0.01 \leq y \leq 0.1$, and x+y=1), titanium silicide, $Ti_xSi_y$ (where $0.01 \leq x < 0.99$, $0.01 \leq y \leq 0.99$, and x+y=1), $Ti_xN_y$ (where $0.3 \leq x < 0.99$, $0.01 \leq y \leq 0.7$, and x+y=1), $Si_xTi_yN_z$ (where $0.01 \leq x < 0.99$, $0.01 \leq y \leq 0.99$, $0.01 \leq y \leq 0.7$, and x+y+z=1). In other embodiments, the shield layer 84 is made of Si, Si enriched SiN, SiC, SiCl, TiSi or SiTiN.

The operations of S1001, S1003 and S1005 of FIG. 10G and FIGS. 10A-10D are the same as the operations of S801, S803 and S805 of FIG. 8G and FIGS. 8A-8D, respectively. As shown in FIG. 8D, after the first conductive layer 83 and the shield layer 84 are formed, and a first annealing operation is performed at S1007 of FIG. 10G, at S1009 of FIG. 10G, a capping layer 85 is formed without performing a fluorine soaking operation, as shown in FIG. 8D. After a second annealing operation is performed at S1011 of FIG. 10G, at S1013 and S1015 of FIG. 10G, the capping layer 85' and the shield layer 84 are removed, as shown in FIG. 10E. Then, as shown in FIG. 10F, at S1019 of FIG. 10G, a second conductive layer 86 is formed, and one or more work function adjustment layers 87 and a gate electrode layer 88 are formed at S1021 of FIG. 10G. In some embodiments, the shield layer 84 is removed after the first annealing operation and prior to the capping layer deposition. In some embodiments, the shield layer 84 is removed after the second annealing and the capping layer removal operation. In some embodiments, at S1017 of FIG. 10G, after shield layer 84 is removed and before the barrier layer and or the second conductive layer is deposited, the first conducting layer 83 is redeposited to recover the first conductive layer loss or damage during the shield layer removal operation.

The various embodiments or examples described herein offer several advantages over the existing art, as set forth above. For example, in the present disclosure, a thin shield layer (e.g., Si, Ti, TiSi, SiN, $Si_xTi_yN_z$) is deposited on a first conductive layer (e.g. TiN layer) to shield the first conductive layer from fluorine etching, oxidation damage, i.e., a bilayer cap structure is formed. The bilayer cap structure enables the use of a fluorinated silicon (FSI) cap to successfully incorporate fluorine into the TiN layer and the high-k gate dielectric layer without causing damage on the TiN layer. The use of the fluorinated silicon cap layer together with the bilayer cap structure helps to significantly improve PMOS Vt, device reliability. The shield layer also helps to protect the first conductive layer (e.g. TiN layer) from atmospheric oxidation damage by isolating the first conductive layer from atmospheric oxygen and/or moisture. The shield layer 84 also helps to block the diffusion of metal (e.g., Al) from the work function adjustment layers 87 and/or from the gate electrode layer 88 into the gate dielectric layer 82, as shown in FIGS. 11A and 11B. FIG. 11A shows an EDAX (energy dispersive x-ray spectroscopy) result of aluminum concentration profile for a structure without the formation of a shield layer 84 and FIG. 11B shows an EDAX result of aluminum concentration profile for a structure with a shield layer 84 according to the embodiments of the present disclosure as set forth above. As shown in FIG. 11B, Al diffusion into the gate dielectric layer 82, 81 is effectively suppressed. In some embodiments, the Al concentration when no shield layer is used is in a range from about 1 atomic % to about 10 atomic %, and when a shield layer is formed, the Al concentration is less than about 0.05 atomic %. This helps to improve the gate oxide quality by reducing the Al defects in the dielectric layer 82, 81, thereby improving device leakage performance. In some embodiments, when the shield layer remains in the final structure, the gate dielectric layer 82 contains Al in an amount of less than 0.05 atomic % and in other embodiments, less than 0.02 atomic %.

Figure 11E:
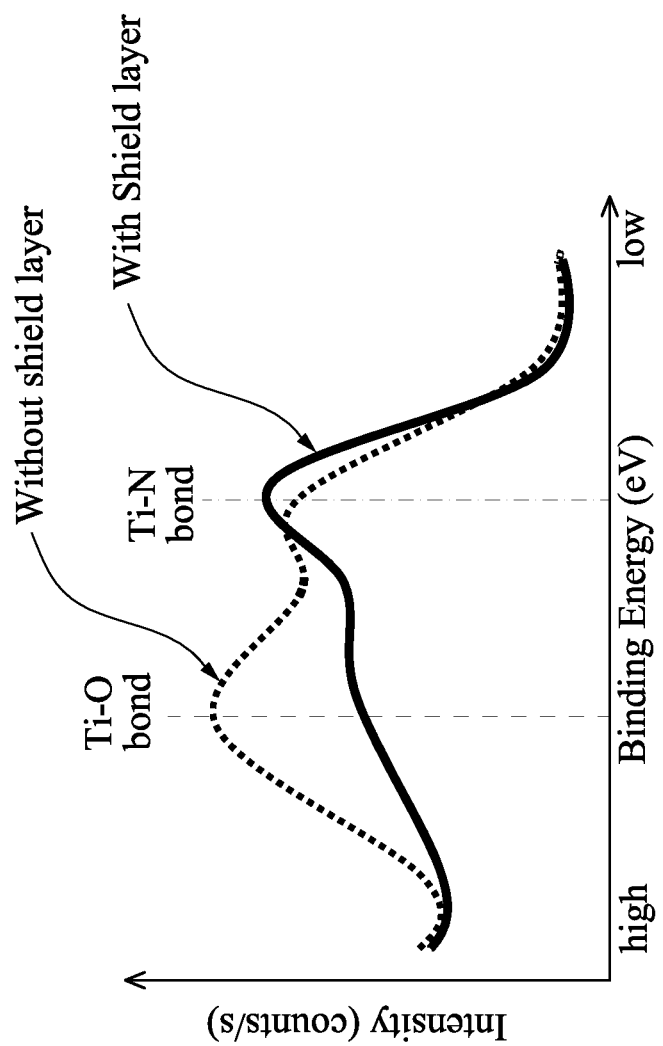
FIG. 11E shows the XPS (x-ray photo electron spectroscopy) spectrums of titanium $2p_{3/2}$ orbital ($Ti2p_{3/2}$) peaks from first conductive layer for the structure according to an embodiment of the present disclosure.

Further, the shield layer 84 can scavenge or trap oxygen from the first conductive layer to control interfacial layer regrowth, as shown in FIGS. 11C and 11D. FIG. 11C shows a ToF (time-of-flight) SIMS (secondary ion mass spectrometry) result for oxygen and FIG. 11D shows a ToFSIMS result for $TiO_2$, for the structure with a shield layer and also for the structure without a shield layer according to an embodiment of the present disclosure. As shown in FIGS. 11C and 11D, regrowth of the interfacial layer 81 and/or oxidation of the first conductive layer 83 is effectively suppressed. The shield layer helps to capture oxygen released from the first conducting layers and/or from the gate dielectric layer during one or more subsequent annealing processes. This oxygen scavenging ability reduces the interfacial layer regrowth during the annealing, thereby decreasing an interfacial layer thickness, which in turn helps to boost the device speed, device Ion-Ioff performance and/or ring oscillator operating frequency performance. FIG. 11E shows the XPS (x-ray photo electron spectroscopy) spectrums of titanium $2p_{3/2}$ orbital ($Ti2p_{3/2}$) peaks from the first conductive layers 83, for the structure with a shield layer and for the structure without a shield layer. As shown in FIG. 11E, with the use of a shield layer, the titanium bonding to oxygen peak is significantly suppressed and the titanium bonding to nitrogen peak is enhanced, indicating the oxidation protection of first conductive layer (e.g. TiN layer) by the shield layer. In some embodiments, the shield layer 84 helps to reduce the ratio of the number of Ti atoms bonding to oxygen atom (Ti—O) to the number of Ti bonding to nitrogen atom (Ti—N) (i.e. Ti—O/Ti—N ratio) of the first conductive layer 83 from the range of about 0.25 to 0.95 (i.e. without use of shield layer 84) to the range of about 0.03-0.48 (i.e. with use of shield layer). In some embodiments, the gate dielectric layer 82 is made of $HfO_2$—$La_2O_3$. In such a case, the shield layer 84 helps to pull out the metal, such as lanthanum, in the gate dielectric layer 82 away from the channel, interfacial layer 81. Out diffusion of lanthanum from the gate dielectric layer 82 towards the shield layer 84 is enhanced, thereby reducing PMOS device threshold voltage and device flicker noise issue, due to reduced amount of lanthanum and dipole scattering at interface of the $HfO_2$—$La_2O_3$ gate dielectric layer 82 and interfacial layer 81. In some embodiments, the La concentration at the interface of $HfO_2$—$La_2O_3$ gate dielectric layer 82 and interfacial layer 81, when no shield layer is used is in a range from about 1 atomic % to about 60 atomic %, and when a shield layer is formed, the La concentration is less than about 0.05 atomic % to about 10 atomic %. More Si amount in Shield layer causes more La out diffusion.

The embodiments as set forth above are not limited to FinFETs and can be applied to other types of n-type and/or p-type transistors, such gate all around (GAA) transistors including lateral gate all around (LGAA) transistors and vertical gate all around (VGAA) transistors.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a gate dielectric layer is formed over a channel region, a first conductive layer is formed over the gate dielectric layer, a shield layer is formed over the first conductive layer, a capping layer is formed over the shield layer, a first annealing operation is performed after the capping layer is formed, the capping layer is removed after the first annealing operation, and a gate electrode layer is formed after the capping layer is removed. In one or more of the foregoing or the following embodiments, the first conductive layer is a metal nitride layer. In one or more of the foregoing or the following embodiments, the first conductive layer is made of TiN. In one or more of the foregoing or the following embodiments, a thickness of the first conductive layer is in a range from 0.3 nm to 30 nm. In one or more of the foregoing or the following embodiments, the shield layer is made of one of Si, $Si_xC_y$ (where $0.9 \leq x \leq 0.99$, $0.01 \leq y \leq 0.1$, and x+y=1), $Si_xCl_y$ (where $0.9 \leq x < 0.99$, $0.01 \leq y \leq 0.1$, and x+y=1), $Si_xN_y$ (where $0.3 \leq x < 0.99$, $0.01 \leq y \leq 0.7$, and x+y=1), Ti, $Ti_xC_y$, $Ti_xCl_y$ (where $0.9 \leq x < 0.99$, $0.01 \leq y \leq 0.1$, and x+y=1), titanium silicide, $Ti_xSi_y$ (where $0.01 \leq x < 0.99$, $0.01 \leq y \leq 0.99$, and x+y=1), $Ti_xN_y$ (where $0.3 \leq x < 0.99$, $0.01 \leq y \leq 0.7$, and x+y=1), and $Si_xTi_yN_z$ (where $0.01 \leq x < 0.99$, $0.01 \leq y \leq 0.99$, $0.01 \leq y \leq 0.7$, and x+y+z=1). In one or more of the foregoing or the following embodiments, a thickness of the shield layer is in a range from 0.5 nm to 30 nm. In one or more of the foregoing or the following embodiments, wherein the capping layer is made of crystalline, polycrystalline or amorphous silicon. In one or more of the foregoing or the following embodiments, the capping layer includes fluorine. In one or more of the foregoing or the following embodiments, a second annealing operation is performed before the capping layer is formed and after the shield layer is formed. In one or more of the foregoing or the following embodiments, an annealing temperature of the first annealing operation is higher than an annealing temperature of the second annealing operation. In one or more of the foregoing or the following embodiments, the annealing temperature of the first annealing operation is in a range from 900° C. to 1300° C. In one or more of the foregoing or the following embodiments, the annealing temperature of the second annealing operation is in a range from 600° C. to 800° C. In one or more of the foregoing or the following embodiments, after the capping layer is removed, the shield layer is removed. In one or more of the foregoing or the following embodiments, after the shield layer is removed, an additional metal nitride layer made of a same material as the first conducting metal nitride layer is formed over the metal nitride layer.

In accordance with another aspect of the present disclosure, in a method of manufacturing a semiconductor device, a gate dielectric layer is formed over a channel region, a first conductive layer is formed over the gate dielectric layer, a shield layer is formed over the first conductive layer, a first annealing operation is performed after the shield layer is formed, a fluorine soaking operation is performed, a capping layer is formed over the shield layer, a second annealing operation is performed after the capping layer is formed, the capping layer is removed after the second annealing operation, and a gate electrode layer is formed after the capping layer is removed. In one or more of the foregoing or the following embodiments, the first conductive layer is made of TiN. In one or more of the foregoing or the following embodiments, the shield layer is made of one of SiN, Ti, TiSi, $Si_xTi_yN_z$, where $0 \leq x < 1$, $0 \leq y \leq 1$, $0 \leq z \leq 1$, and x+y+z=1. In one or more of the foregoing or the following embodiments, an annealing temperature of the first annealing operation is lower than an annealing temperature of the second annealing operation. In one or more of the foregoing or the following embodiments, the annealing temperature of the first annealing operation is in a range from 600° C. to 800° C., and the annealing temperature of the second annealing operation is in a range from 900° C. to 1300° C.

In accordance with another aspect of the present disclosure, in a method of manufacturing a semiconductor device, a gate dielectric layer is formed over a channel region, a first conductive layer is formed over the gate dielectric layer, a shield layer is formed over the first conductive layer, a first annealing operation is performed after the shield layer is formed, a capping layer is formed over the shield layer, a second annealing operation is performed after the capping layer is formed, the capping layer and the shield layer are removed after the second annealing operation, and a gate electrode layer is formed after the capping layer is removed.

In accordance with another aspect of the present disclosure, a semiconductor device, includes a channel layer, a gate dielectric layer disposed over the channel layer, a metal nitride layer disposed over the gate dielectric layer, a shield layer disposed over the metal nitride layer, and a gate electrode layer disposed over the cap layer. The metal nitride layer is made of TiN, and the shield layer is made of one selected from the group consisting of $Si_xN_y$ (where $0.3 \leq x < 0.75$, $0.25 \leq y \leq 0.7$, and x+y=1), Ti, $Ti_xC_y$ (where $0.9 \leq x < 0.99$, $0.01 \leq y \leq 0.1$, and x+y=1), $Ti_xCl_y$ (where $0.9 \leq x < 0.99$, $0.01 \leq y \leq 0.1$, and x+y=1), titanium silicide, $Ti_xSi_y$ (where $0.25 \leq x < 0.99$, $0.01 \leq y \leq 0.75$, and x+y=1), $Ti_xN_y$ (where $0.3 \leq x < 0.99$, $0.01 \leq y \leq 0.7$, and x+y=1), and $Si_xTi_yN_z$ (where $0.01 \leq x < 0.75$, $0.01 \leq y \leq 0.99$, $0.01 \leq y \leq 0.7$, and x+y+z=1). In one or more of the foregoing or the following embodiments, a thickness T1 of the metal nitride layer and a thickness T2 of the shield layer satisfy $0.05 \leq T2/(T1+T2) < 0.85$. In one or more of the foregoing or the following embodiments, a thickness of the metal nitride layer is in a range from 0.3 nm to 30 nm. In one or more of the foregoing or the following embodiments, a thickness of the shield layer is in a range from 0.5 nm to 30 nm. In one or more of the foregoing or the following embodiments, the shield layer includes fluorine in an amount of 0.02 atomic % to 75 atomic %. In one or more of the foregoing or the following embodiments, the metal nitride layer includes fluorine in an amount of 0.02 atomic % to 55 atomic %. In one or more of the foregoing or the following embodiments, the gate dielectric layer includes fluorine in an amount of 0.01 atomic % to 40 atomic %. In one or more of the foregoing or the following embodiments, the shield layer is made of SiN.

In accordance with another aspect of the present disclosure, a semiconductor device, includes a channel layer, a gate dielectric layer disposed over the channel layer, a metal nitride layer disposed over the gate dielectric layer, and a gate electrode layer disposed over the metal nitride layer. The metal nitride layer is made of TiN, and the metal nitride layer and the gate dielectric layer includes fluorine. In one or more of the foregoing or the following embodiments, an amount of fluorine in the gate dielectric layer is smaller than an amount of fluorine in the metal nitride layer. In one or more of the foregoing or the following embodiments, the metal nitride layer includes fluorine in an amount of 0.02 atomic % to 55 atomic %. In one or more of the foregoing or the following embodiments, the gate dielectric layer includes fluorine in an amount of 0.01 atomic % to 40 atomic %. In one or more of the foregoing or the following embodiments, a thickness of the metal nitride layer is in a range from 0.3 nm to 30 nm. In one or more of the foregoing or the following embodiments, the semiconductor device includes gate sidewall spacers made of a silicon based insulating material and including fluorine.

In accordance with another aspect of the present disclosure, a semiconductor device includes a fin structure having channel layer, an isolation insulating layer, a gate dielectric layer disposed over the channel layer, a metal nitride layer disposed over the gate dielectric layer, a shield layer disposed over the metal nitride layer, and a gate electrode layer disposed over the cap layer. The metal nitride layer is made of TiN, and the shield layer is made of one selected from the group consisting of Si, $Si_xC_y$ (where $0.9 \le x < 0.99$, $0.01 \le y \le 0.1$, and $x+y=1$), $Si_xCl_y$ (where $0.9 \le x < 0.99$, $0.01 \le y \le 0.1$, and $x+y=1$), $Si_xN_y$ (where $0.3 \le x < 0.99$, $0.01 \le y \le 0.7$, and $x+y=1$), Ti, $Ti_xC_y$ (where $0.9 \le x < 0.99$, $0.01 \le y \le 0.1$, and $x+y=1$), $Ti_xCl_y$ (where $0.9 \le x < 0.99$, $0.01 \le y \le 0.1$, and $x+y=1$), titanium silicide, $Ti_xSi_y$ (where $0.01 \le x < 0.99$, $0.01 \le y \le 0.99$, and $x+y=1$), $Ti_xN_y$ (where $0.3 \le x < 0.99$, $0.01 \le y \le 0.7$, and $x+y=1$), and $Si_xTi_yN_z$ (where $0.01 \le x < 0.99$, $0.01 \le y \le 0.99$, $0.01 \le y \le 0.7$, and $x+y+z=1$). In one or more of the foregoing or the following embodiments, a thickness T1 of the metal nitride layer and a thickness T2 of the shield layer satisfy $0.05 \le T2/(T1+T2) < 0.85$ In one or more of the foregoing or the following embodiments, the metal nitride layer, the shield layer and the gate dielectric layer includes fluorine, and an amount of fluorine in the gate dielectric layer is smaller than an amount of fluorine in the metal nitride layer and an amount of fluorine in the shield layer. In one or more of the foregoing or the following embodiments, the shield layer includes fluorine in an amount of 0.02 atomic % to 75 atomic %. In one or more of the foregoing or the following embodiments, the metal nitride layer includes fluorine in an amount of 0.02 atomic % to 55 atomic %. In one or more of the foregoing or the following embodiments, the gate dielectric layer includes fluorine in an amount of 0.01 atomic % to 40 atomic %.

In accordance with one aspect of the present disclosure, in a method of manufacturing a semiconductor device, an interfacial layer is formed over a channel region, a gate dielectric layer is formed over the interfacial layer, a first conductive layer is formed over the gate dielectric layer, a shield layer is formed over the first conductive layer, a capping layer is formed over the shield layer, a first annealing operation is performed after the capping layer is formed, the capping layer is removed after the first annealing operation, a second conductive layer as a barrier layer and a gate electrode layer are formed over the shield layer after the capping layer is removed. In one or more of the foregoing or the following embodiments, the first conductive layer is made of TiN, and a thickness of the first conductive layer is in a range from 0.3 nm to 30 nm. In one or more of the foregoing or the following embodiments, the shield layer is made of one selected from the group consisting of $Si_xN_y$ (where $0.3 \le x < 0.75$, $0.25 \le y \le 0.7$, and $x+y=1$), Ti, $Ti_xC_y$ (where $0.9 \le x < 0.99$, $0.01 \le y \le 0.1$, and $x+y=1$), $Ti_xCl_y$ (where $0.9 \le x < 0.99$, $0.01 \le y \le 0.1$, and $x+y=1$), titanium silicide, $Ti_xSi_y$ (where $0.25 \le x < 0.99$, $0.01 \le y \le 0.75$, and $x+y=1$), $Ti_xN_y$ (where $0.3 \le x < 0.99$, $0.01 \le y \le 0.7$, and $x+y=1$), and $Si_xTi_yN_z$ (where $0.01 \le x < 0.75$, $0.01 \le y \le 0.99$, $0.01 \le y \le 0.7$, and $x+y+z=1$). In one or more of the foregoing or the following embodiments, the shield layer is formed without breaking vacuum after the first conductive layer is formed. In one or more of the foregoing or the following embodiments, the shield layer is formed by one of ALD and CVD processes at a temperature ranging from 250° C. to 600° C. and at a pressure ranging from 1 Torr to 150 Torr. In one or more of the foregoing or the following embodiments, a thickness of the shield layer is in a range from 0.5 nm to 30 nm and wherein a thickness T1 of the metal nitride layer and a thickness T2 of the shield layer satisfy $0.05 \le T2/(T1+T2) < 0.85$. In one or more of the foregoing or the following embodiments, the capping layer is made of crystalline, polycrystalline or amorphous silicon. In one or more of the foregoing or the following embodiments, the capping layer includes fluorine. In one or more of the foregoing or the following embodiments, a second annealing operation is performed before the capping layer is formed and after the shield layer is formed. In one or more of the foregoing or the following embodiments, an annealing temperature of the first annealing operation is higher than an annealing temperature of the second annealing operation, the annealing temperature of the first annealing operation is in a range from 900° C. to 1300° C., and the annealing temperature of the second annealing operation is in a range from 600° C. to 800° C. In one or more of the foregoing or the following embodiments, the shield layer is made of one of Si, $Si_xC_y$ (where $0.9 \le x < 0.99$, $0.01 \le y \le 0.1$, and $x+y=1$), $Si_xCl_y$ (where $0.9 \le x < 0.99$, $0.01 \le y \le 0.1$, and $x+y=1$), $Si_xN_y$ (where $0.3 \le x < 0.99$, $0.01 \le y \le 0.7$, and $x+y=1$), Ti, $Ti_xC_y$ (where $0.9 \le x < 0.99$, $0.01 \le y \le 0.1$, and $x+y=1$), $Ti_xCl_y$ (where $0.9 \le x < 0.99$, $0.01 \le y \le 0.1$, and $x+y=1$), titanium silicide, $Ti_xSi_y$ (where $0.01 \le x < 0.99$, $0.01 \le y \le 0.99$, and $x+y=1$), $Ti_xN_y$ (where $0.3 \le x < 0.99$, $0.01 \le y \le 0.7$, and $x+y=1$), and $Si_xTi_yN_z$ (where $0.01 \le x < 0.99$, $0.01 \le y \le 0.99$, $0.01 \le y \le 0.7$, and $x+y+z=1$). In one or more of the foregoing or the following embodiments, after the capping layer is removed, the shield layer is removed. In one or more of the foregoing or the following embodiments, a second annealing operation is performed before the capping layer is formed and after the shield layer is formed. In one or more of the foregoing or the following embodiments, the second annealing operation is performed at a temperature range from 450° C. to 850° C. In one or more of the foregoing or the following embodiments, the shield layer is removed after the second annealing operation and before the capping layer is formed. In one or more of the foregoing or the following embodiments, after the shield layer is removed, an additional metal nitride layer made of a same material as the metal nitride layer is formed over the metal nitride layer.

In accordance with another aspect of the present disclosure, in a method of manufacturing a semiconductor device, a gate dielectric layer is formed over a channel region, a first conductive layer is formed over the gate dielectric layer, a shield layer is formed over the first conductive layer, a first annealing operation is performed after the shield layer is formed, a fluorine soaking operation is performed, a capping layer is formed over the shield layer, a second annealing operation is performed after the capping layer is formed, the capping layer is removed after the second annealing operation, the shield layer is removed after the capping layer is removed, and a second conductive layer as a barrier layer and a gate electrode layer are formed over the first conductive layer. In one or more of the foregoing or the following embodiments, the shield layer is made of one selected from the group consisting of Si, $Si_xC_y$ (where $0.9 \le x<0.99$, $0.01 \le y \le 0.1$, and $x+y=1$), $Si_xCl_y$ (where $0.9 \le x<0.99$, $0.01 \le y \le 0.1$, and $x+y=1$), $Si_xN_y$ (where $0.3 \le x<0.99$, $0.01 \le y \le 0.7$, and $x+y=1$), Ti, $Ti_xC_y$ (where $0.9 \le x<0.99$, $0.01 \le y \le 0.1$, and $x+y=1$), $Ti_xCl_y$ (where $0.9 \le x<0.99$, $0.01 \le y \le 0.1$, and $x+y=1$), titanium silicide, $Ti_xSi_y$ (where $0.01 \le x<0.99$, $0.01 \le y \le 0.99$, and $x+y=1$), $Ti_xN_y$ (where $0.3 \le x<0.99$, $0.01 \le y \le 0.7$, and $x+y=1$), and $Si_xTi_yN_z$ (where $0.01 \le x<0.99$, $0.01 \le y \le 0.99$, $0.01 \le y \le 0.7$, and $x+y+z=1$). In one or more of the foregoing or the following embodiments, a third annealing operation is performed after the shield layer is removed, in temperature range from 450° C. to 850° C. In one or more of the foregoing or the following embodiments, after the shield layer is removed, an additional metal nitride layer made of a same material as the metal nitride layer is formed over the metal nitride layer.

In accordance with another aspect of the present disclosure, in a method of manufacturing a semiconductor device, a gate dielectric layer is formed over a channel region, a first conductive layer is formed over the gate dielectric layer, a shield layer is formed over the first conductive layer, a first annealing operation is performed after the shield layer is formed, a fluorine soaking operation is performed, the shield layer is removed, a capping layer is formed over the first conductive layer, a second annealing operation is performed after the capping layer is formed, the capping layer is removed after the second annealing operation, and a second conductive layer as a barrier layer and a gate electrode layer are formed over the first conductive layer. In one or more of the foregoing or the following embodiments, the shield layer is made of one selected from the group consisting of Si, $Si_xC_y$ (where $0.9 \le x<0.99$, $0.01 \le y \le 0.1$, and $x+y=1$), $Si_xCl_y$ (where $0.9 \le x<0.99$, $0.01 \le y \le 0.1$, and $x+y=1$), $Si_xN_y$ (where $0.3 \le x<0.99$, $0.01 \le y \le 0.7$, and $x+y=1$), Ti, $Ti_xC_y$ (where $0.9 \le x<0.99$, $0.01 \le y \le 0.1$, and $x+y=1$), $Ti_xCl_y$ (where $0.9 \le x<0.99$, $0.01 \le y \le 0.1$, and $x+y=1$), titanium silicide, $Ti_xSi_y$ (where $0.01 \le x<0.99$, $0.01 \le y \le 0.99$, and $x+y=1$), $Ti_xN_y$ (where $0.3 \le x<0.99$, $0.01 \le y \le 0.7$, and $x+y=1$), and $Si_xTi_yN_z$ (where $0.01 \le x<0.99$, $0.01 \le y \le 0.99$, $0.01 \le y \le 0.7$, and $x+y+z=1$). In one or more of the foregoing or the following embodiments, after the shield layer is removed, an additional metal nitride layer made of a same material as the metal nitride layer is formed over the metal nitride layer.

In accordance with another aspect of the present disclosure, in a method of manufacturing a semiconductor device, a gate dielectric layer is formed over a channel region, a first conductive layer is formed over the gate dielectric layer, a shield layer is formed over the first conductive layer, a first annealing operation is performed after the shield layer is formed, a fluorine soaking operation is performed, a capping layer is formed over the shield layer, a second annealing operation is performed after the capping layer is formed, the capping layer is removed after the second annealing operation, and a gate electrode layer is formed over the gate dielectric layer after the capping layer is removed. In one or more of the foregoing or the following embodiments, the shield layer is made of one selected of Si, $Si_xC_y$ (where $0.9 \le x<0.99$, $0.01 \le y \le 0.1$, and $x+y=1$), $Si_xCl_y$ (where $0.9 \le x<0.99$, $0.01 \le y \le 0.1$, and $x+y=1$), $Si_xN_y$ (where $0.3 \le x<0.99$, $0.01 \le y \le 0.7$, and $x+y=1$), Ti, $Ti_xC_y$ (where $0.9 \le x<0.99$, $0.01 \le y \le 0.1$, and $x+y=1$), $Ti_xCl_y$ (where $0.9 \le x<0.99$, $0.01 \le y \le 0.1$, and $x+y=1$), titanium silicide, $Ti_xSi_y$ (where $0.01 \le x<0.99$, $0.01 \le y \le 0.99$, and $x+y=1$), $Ti_xN_y$ (where $0.3 \le x<0.99$, $0.01 \le y \le 0.7$, and $x+y=1$), and $Si_xTi_yN_z$ (where $0.01 \le x<0.99$, $0.01 \le y \le 0.99$, $0.01 \le y \le 0.7$, and $x+y+z=1$). In one or more of the foregoing or the following embodiments, the annealing temperature of the first annealing operation is in a range from 600° C. to 800° C., and the annealing temperature of the second annealing operation is in a range from 900° C. to 1300° C.

In accordance with one aspect of the present disclosure, a semiconductor device includes a channel layer, an interfacial layer and a gate dielectric layer disposed over the channel layer, a metal nitride layer disposed over the gate dielectric layer, a shield layer disposed over the metal nitride layer, and a barrier layer and a gate electrode layer disposed over the shield layer. The metal nitride layer is made of metal nitride such as TiN, and the shield layer is made of one selected from the group consisting of $Si_xN_y$ (where $0.3 \le x<0.75$, $0.25 \le y \le 0.7$, and $x+y=1$), Ti, $Ti_xC_y$ (where $0.9 \le x<0.99$, $0.01 \le y \le 0.1$, and $x+y=1$), $Ti_xCl_y$ (where $0.9 \le x<0.99$, $0.01 \le y \le 0.1$, and $x+y=1$), titanium silicide, $Ti_xSi_y$ (where $0.25 \le x<0.99$, $0.01 \le y \le 0.75$, and $x+y=1$), $Ti_xN_y$ (where $0.3 \le x<0.99$, $0.01 \le y \le 0.7$, and $x+y=1$), and $Si_xTi_yN_z$ (where $0.01 \le x<0.75$, $0.01 \le y \le 0.99$, $0.01 \le y \le 0.7$, and $x+y+z=1$). In one or more of the foregoing or the following embodiments, a thickness of the metal nitride layer is in a range from 0.3 nm to 30 nm, a thickness of the shield layer is in a range from 0.5 nm to 30 nm, and a thickness T1 of the metal nitride layer and a thickness T2 of the shield layer satisfy $0.05 \le T2/(T1+T2)<0.85$. In one or more of the foregoing or the following embodiments, the metal nitride layer includes oxygen in an amount of 1.5 atomic % to 65 atomic %. In one or more of the foregoing or the following embodiments, the gate dielectric layer includes aluminum in an amount of less than 0.05 atomic %.

In accordance with another aspect of the present disclosure, a semiconductor device includes a channel layer, an interfacial layer, gate dielectric layer disposed over the channel layer, a metal nitride layer disposed over the gate dielectric layer, and a barrier layer and a gate electrode layer disposed over the metal nitride layer. The metal nitride layer is made of TiN. In one or more of the foregoing or the following embodiments, the semiconductor device further includes an intermixing layer on an upper surface of the metal nitride layer formed by depositing a shield layer on the metal nitride layer and removing the shield layer from the upper surface of metal nitride layer. The shield layer used is one selected from the group consisting of Si, $Si_xC_y$ (where $0.9 \le x<0.99$, $0.01 \le y \le 0.1$, and $x+y=1$), $Si_xCl_y$ (where $0.9 \le x<0.99$, $0.01 \le y \le 0.1$, and $x+y=1$), $Si_xN_y$ (where $0.3 \le x<0.99$, $0.01 \le y \le 0.7$, and $x+y=1$), Ti, $Ti_xC_y$ (where $0.9 \le x<0.99$, $0.01 \le y \le 0.1$, and $x+y=1$), $Ti_xCl_y$ (where $0.9 \le x<0.99$, $0.01 \le y \le 0.1$, and $x+y=1$), titanium silicide, $Ti_xSi_y$ (where $0.01 \le x<0.99$, $0.01 \le y \le 0.99$, and $x+y=1$), $Ti_xN_y$ (where $0.3 \le x<0.99$, $0.01 \le y \le 0.7$, and $x+y=1$), and $Si_xTi_yN_z$ (where $0.01 \le x<0.99$, $0.01 \le y \le 0.99$, $0.01 \le y \le 0.7$, and $x+y+z=1$). In one or more of the foregoing or the following embodiments, the gate dielectric layer includes aluminum in an amount of about 0.1% to 6% atomic %.

In accordance with another aspect of the present disclosure, a semiconductor device includes a channel layer, an interfacial layer disposed over the channel layer, a gate dielectric layer disposed over the interfacial layer, a metal nitride layer disposed over the gate dielectric layer, a shield layer disposed over the metal nitride layer, a barrier layer disposed over the shield layer, and a gate electrode layer disposed over the barrier layer. The metal nitride layer is made of TiN, and the shield layer is made of one selected from the group consisting of $Si_xN_y$ (where $0.3 \le x < 0.75$, $0.25 \le y \le 0.7$, and $x+y=1$), Ti, $Ti_xC_y$ (where $0.9 \le x < 0.99$, $0.01 \le y \le 0.1$, and $x+y=1$), $Ti_xCl_y$ (where $0.9 \le x < 0.99$, $0.01 \le y \le 0.1$, and $x+y=1$), titanium silicide, $Ti_xSi_y$ (where $0.25 \le x < 0.99$, $0.01 \le y \le 0.75$, and $x+y=1$), $Ti_xN_y$ (where $0.3 \le x < 0.99$, $0.01 \le y \le 0.7$, and $x+y=1$), $Si_xTi_yN_z$ (where $0.01 \le x < 0.75$, $0.01 \le y \le 0.99$, $0.01 < y < 0.7$, and $x+y+z=1$). In one or more of the foregoing or the following embodiments, a thickness of the metal nitride layer is in a range from 0.3 nm to 30 nm, a thickness of the shield layer is in a range from 0.5 nm to 30 nm, and a thickness T1 of the metal nitride layer and a thickness T2 of the shield layer satisfy $0.05 \le T2/(T1+T2) < 0.85$. In one or more of the foregoing or the following embodiments, the shield layer is partially crystalline or completely amorphous, and the percentage of crystallinity of the shield layer is in a range from 0% to 90%. In one or more of the foregoing or the following embodiments, the metal nitride layer, the shield layer and the gate dielectric layer include fluorine, and an amount of fluorine in the gate dielectric layer is smaller than an amount of fluorine in the metal nitride layer and an amount of fluorine in the shield layer. In one or more of the foregoing or the following embodiments, the shield layer includes fluorine in an amount of 0.02 atomic % to 75 atomic %, the metal nitride layer includes fluorine in an amount of 0.02 atomic % to 55 atomic %, and the gate dielectric layer includes fluorine in an amount of 0.01 atomic % to 40 atomic %. In one or more of the foregoing or the following embodiments, the semiconductor device further includes gate sidewall spacers made of a silicon based insulating material and including fluorine. In one or more of the foregoing or the following embodiments, the shield layer, metal nitride layer, gate dielectric layer do not includes fluorine, or include fluorine in an amount of less than 0.6 atomic %. In one or more of the foregoing or the following embodiments, the shield layer is made of SiN. In one or more of the foregoing or the following embodiments, the metal nitride layer includes oxygen in an amount of 1.5 atomic % to 65 atomic %. In one or more of the foregoing or the following embodiments, in the metal nitride layer, a ratio of a number of titanium atoms bonding to oxygen (Ti—O) to a number of titanium bonding to nitrogen (Ti—N) is in a range from 0.03 to 0.48. In one or more of the foregoing or the following embodiments, the gate dielectric layer includes aluminum in an amount of less than 0.05 atomic %.

In accordance with another aspect of the present disclosure, a semiconductor device includes a channel layer, an interfacial layer disposed over the channel layer, a gate dielectric layer disposed over the interfacial layer, a metal nitride layer disposed over the gate dielectric layer, a barrier layer disposed over the metal nitride layer, and a gate electrode layer disposed over the barrier layer. The metal nitride layer is made of TiN. In one or more of the foregoing or the following embodiments, the semiconductor device further includes an intermixing layer on an upper surface of the metal nitride layer formed by depositing a shield layer on the metal nitride layer and removing the shield layer from the upper surface of metal nitride layer. The shield layer is one selected from the group consisting of Si, $Si_xC_y$, $Si_xCl_y$ (where $0.9 \le x < 0.99$, $0.01 \le y \le 0.1$, and $x+y=1$), $Si_xN_y$ (where $0.3 \le x < 0.99$, $0.01 \le y \le 0.7$, and $x+y=1$), Ti, $Ti_xC_y$, $Ti_xCl_y$ (where $0.9 \le x < 0.99$, $0.01 \le y \le 0.1$, and $x+y=1$), titanium silicide, $Ti_xSi_y$ (where $0.01 \le x < 0.99$, $0.01 \le y \le 0.99$, and $x+y=1$), $Ti_xN_y$ (where $0.3 \le x < 0.99$, $0.01 \le y \le 0.7$, and $x+y=1$), and $Si_xTi_yN_z$ (where $0.01 \le x < 0.99$, $0.01 \le y \le 0.99$, $0.01 < y < 0.7$, and $x+y+z=1$). In one or more of the foregoing or the following embodiments, the metal nitride layer, the shield layer and the gate dielectric layer include fluorine, and an amount of fluorine in the gate dielectric layer is smaller than an amount of fluorine in the metal nitride layer. In one or more of the foregoing or the following embodiments, the metal nitride layer includes fluorine in an amount of 0.02 atomic % to 55 atomic %, and the gate dielectric layer includes fluorine in an amount of 0.01 atomic % to 40 atomic %. In one or more of the foregoing or the following embodiments, a thickness of the metal nitride layer is in a range from 0.3 nm to 30 nm. In one or more of the foregoing or the following embodiments, the metal nitride layer includes oxygen in an amount of 1.5 atomic % to 65 atomic %. In one or more of the foregoing or the following embodiments, in the metal nitride layer, a ratio of a number of titanium atoms bonding to oxygen to a number of titanium bonding to nitrogen is in a range from 0.03 to about 0.48. In one or more of the foregoing or the following embodiments, the gate dielectric layer includes aluminum in an amount of about 0.1% to 65 atomic %. In one or more of the foregoing or the following embodiments, the semiconductor device further includes gate sidewall spacers made of a silicon based insulating material and including fluorine. In one or more of the foregoing or the following embodiments, the shield layer, metal nitride layer, gate dielectric layer do not includes fluorine, or include fluorine in an amount of less than 0.6 atomic %.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a gate dielectric layer over a channel region;
    forming a bilayer cap structure by performing operations comprising:
        forming a first layer, which is conductive, over the gate dielectric layer;
        forming a second layer over the first layer, wherein the second layer is thinner than the first layer;
    performing a first annealing operation after the second layer is formed;
    performing a fluorine soaking operation;
    forming a third layer over the second layer;
    performing a second annealing operation after the third layer is formed;
    removing the third layer after the second annealing operation; and
    forming a gate electrode layer after the third layer is removed.

2. The method of claim 1, wherein the first layer is a metal nitride layer.

3. The method of claim 1, wherein a thickness of the first layer is in a range from 0.3 nm to 30 nm.

4. The method of claim 1, wherein the second layer is made of $Si_xTi_yN_z$, where $0≤x<1$, $0≤y≤1$, $0≤z<1$, and $x+y+z=1$.

5. The method of claim 1, wherein a thickness of the second layer is in a range from 0.5 nm to 30 nm.

6. The method of claim 1, wherein the third layer is made of crystalline, polycrystalline or amorphous silicon.

7. The method of claim 6, wherein the third layer includes fluorine.

8. The method of claim 1, wherein an annealing temperature of the second annealing operation is higher than an annealing temperature of the first annealing operation.

9. The method of claim 8, wherein the annealing temperature of the second annealing operation is in a range from 900° C. to 1300° C.

10. The method of claim 8, wherein the annealing temperature of the first annealing operation is in a range from 600° C. to 800° C.

11. The method of claim 2, further comprising, after the third layer is removed, removing the second layer.

12. The method of claim 11, wherein after the second layer is removed, a fourth layer made of a same material as the first layer is formed over the first layer.

13. A method of manufacturing a semiconductor device, comprising:
forming a gate dielectric layer over a channel region;
forming a bilayer cap structure by performing operations comprising:
forming a first layer made of TiN over the gate dielectric layer;
forming a second layer over the first layer, wherein a thickness T1 of the first layer and a thickness T2 of the second layer satisfy $0.05≤T2/(T1+T2)<0.85$;
performing a first annealing operation after the second layer is formed;
performing a fluorine soaking operation;
forming a third layer over the second layer;
performing a second annealing operation after the third layer is formed;
removing the third layer after the second annealing operation; and
forming a gate electrode layer after the third layer is removed.

14. The method of claim 13, wherein the second layer is made of $Si_xTi_yN_z$, where $0≤x<1$, $0≤y≤1$, $0≤z<1$, and $x+y+z=1$.

15. The method of claim 13, wherein an annealing temperature of the first annealing operation is lower than an annealing temperature of the second annealing operation.

16. The method of claim 13, wherein:
the annealing temperature of the first annealing operation is in a range from 600° C. to 800° C., and
the annealing temperature of the second annealing operation is in a range from 900° C. to 1300° C.

17. A method of manufacturing a semiconductor device, comprising: forming a gate dielectric layer over a channel region; forming a bilayer cap structure by performing operations comprising: forming a first conductive layer over the gate dielectric layer; forming a shield layer over the first conductive layer, wherein a thickness T1 of the first layer and a thickness T2 of the shield layer satisfy $T2/(T1+T2)<0.85$ and $0.5$ nm$<T2<30$ nm; performing a first annealing operation after the shield layer is formed; performing a fluorine soaking operation; forming a capping layer containing fluorine over the shield layer; performing a second annealing operation after the capping layer is formed; removing the capping layer after the second annealing operation; and forming a gate electrode layer after the capping layer is removed, wherein the annealing temperature of the first annealing operation is in a range from 600° C. to 800° C., and the annealing temperature of the second annealing operation is in a range from 900° C. to 1300° C.

18. The method of claim 17, further comprising removing the shield layer after the second annealing operation.

19. The method of claim 13, wherein the third layer includes fluorine.

20. The method of claim 13, wherein a thickness of the second layer is in a range from 0.5 nm to 30 nm.

* * * * *